US 6,693,713 B1

(12) United States Patent
Nakajima

(10) Patent No.: US 6,693,713 B1
(45) Date of Patent: Feb. 17, 2004

(54) MARK DETECTION METHOD, EXPOSURE METHOD, DEVICE MANUFACTURING METHOD, MARK DETECTION APPARATUS, EXPOSURE APPARATUS, AND DEVICE

(75) Inventor: Shin-ichi Nakajima, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/743,989

(22) PCT Filed: Jul. 22, 1999

(86) PCT No.: PCT/JP99/03926

§ 371 (c)(1),
(2), (4) Date: Jan. 18, 2001

(87) PCT Pub. No.: WO00/05683

PCT Pub. Date: Feb. 3, 2000

(30) Foreign Application Priority Data

Jul. 22, 1998 (JP) .......................................... 10-206974

(51) Int. Cl.[7] .............................................. G01B 11/00
(52) U.S. Cl. ..................................................... 356/400
(58) Field of Search ............................... 356/400, 401, 356/141.4; 382/151, 207.99, 295; 355/53, 55; 345/428

(56) References Cited

U.S. PATENT DOCUMENTS

| 5,151,750 A | 9/1992 | Magome et al. ............ 356/401 |
| 5,418,899 A | * 5/1995 | Aoki et al. .................. 345/668 |
| 5,473,410 A | 12/1995 | Nishi ........................... 355/53 |
| 5,528,118 A | 6/1996 | Lee ........................ 318/568.17 |
| 5,623,853 A | 4/1997 | Novak et al. ............ 74/490.09 |
| 6,018,600 A | * 1/2000 | Levin et al. ................ 382/284 |
| 6,362,802 B1 | * 3/2002 | Fujiwara et al. .............. 345/87 |

FOREIGN PATENT DOCUMENTS

| JP | 2-272305 | | 11/1990 |
| JP | 04-079571 | * | 3/1992 |
| JP | 8-166475 A | | 6/1996 |
| JP | 8-330224 A | | 12/1996 |
| JP | 9-128540 | | 5/1997 |
| JP | 9-203621 | | 8/1997 |

* cited by examiner

Primary Examiner—Diane I. Lee
(74) Attorney, Agent, or Firm—Oliff & Berridge, PLC

(57) ABSTRACT

The object of the present invention is to provide a mark detection method, an exposure method, a device manufacturing method, a mark detection apparatus, an exposure apparatus, and a device manufactured by the use of the exposure apparatus, which are capable of reducing a position measurement error in a short time even in the case where a sampling interval must be set to about 0.2 times or more of a lower limit of a minimum periodic component. In the present invention, a mark formed on an object is irradiated with a detection beam, an image of the mark is picked up through an image-forming system, the image of the mark formed on an image pickup device is converted into an electrical image signal, a signal related to the image signal is output at predetermined sampling intervals, and a signal related to the image signal is interpolated in a cycle equal to or less than the predetermined sampling interval.

51 Claims, 21 Drawing Sheets

MARK DETECTION METHOD, EXPOSURE METHOD, DEVICE MANUFACTURING METHOD, MARK DETECTION APPARATUS, EXPOSURE APPARATUS, AND DEVICE

TECHNICAL FIELD

The present invention relates to a mark detection method, an exposure method, a device manufacturing method, a mark detection apparatus, and an exposure apparatus. More particularly, the present invention relates to a mark detection method for detecting a mark for position measurement that is formed on an object such as a semiconductor substrate or a liquid crystal display device, an exposure method for transferring a predetermined pattern on a substrate aligned by the use of the mark detection method, a device manufacturing method using the exposure method, a mark detection apparatus for detecting a mark for position measurement which is formed on an object such as a semiconductor substrate or a liquid crystal display device, an exposure apparatus for transferring a predetermined pattern onto a substrate aligned by the mark detection apparatus, and a device manufactured by the exposure apparatus.

BACKGROUND ART

In manufacturing a semiconductor device and a liquid crystal display device, a variety of planar techniques are utilized. In the planar techniques, a finely patterned image formed on a photomask and a reticle (hereinafter, referred to as reticle) by the use of an exposure apparatus is projected and exposed on a substrate such as a semiconductor wafer or glass plate on which a photosensitive agent such as photoresist is coated (hereinafter, referred to as wafer).

The reticle pattern is projected and exposed by the use of, for example, an exposure apparatus of a step-and-repeat system in such a manner that a position of the reticle and a position of the wafer are adjusted (aligned) with high accuracy and the reticle pattern is superposed on a pattern already formed on the wafer.

Particularly in recent years, high densification has been required for semiconductor circuits. Accordingly, also in the alignment of the exposure apparatus, as the pattern of the semiconductor circuit or the like becomes finer, a demand for an alignment performed with higher accuracy has increased, and various processes for alignment have been made.

In general, the alignment of the reticle is performed using exposure light.

Among alignment systems for the reticle, there is a Visual Reticle Alignment (VRA) system or the like, in which an alignment mark drawn on a reticle is irradiated with exposure light, and image data of the alignment mark picked up by a CCD camera or the like is subjected to image processing, and a mark position is measured.

The following are types of alignment sensors for wafers.
(1) Laser Step Alignment (LSA)

This sensor is a sensor for irradiating alignment marks arranged as a line of dots on a wafer with a laser beam in order to detect a mark position by the use of light diffracted or scattered by the mark.
(2) Field Image Alignment (FIA)

This sensor is a sensor for irradiating alignment marks arranged as a line of dots with light having a large wavelength bandwidth using a halogen lamp or the like as a light source, and performing image processing of the image data of an alignment mark imaged by a CCD camera or the like in order to measure a mark position.
(3) Laser Interferometric Alignment (LIA)

This sensor is a sensor for irradiating alignment marks arranged in a diffraction grating pattern on a wafer from two directions using laser beams having slightly different frequencies and causing the two generated diffraction lights to interfere with each other in order to measure a position of the alignment mark from the phase obtained through the interference.

In the alignment by these optical systems, first, an alignment mark on the reticle is detected and processed to measure a position coordinate thereof. Next, an alignment mark on the wafer is detected and processed to measure a position coordinate thereof, thus position of a shot to be superposed is determined. Based on these results, the wafer is moved by a wafer stage to perform an alignment so that a pattern image of the reticle can be superposed on the shot position, and the pattern image of the reticle is projected and exposed on the wafer.

In some of the above-described alignment systems, processing is performed after a one-dimensional image or a two-dimensional image is obtained as an alignment signal.

For the case of a two-dimensional image, by adding mark portions in the measured direction, it can also be treated as a one-dimensional image.

These signals are originally signals that are continuously distributed with respect to the position, but for convenience of signal transmission of an image pickup device, the signals will be extracted as signals sampled at a predetermined interval. For example, when an image processing sensor, such as a CCD camera or a line sensor, is used as an image pickup device, since the pixel size is limited, the signals will be sampled at an interval determined by the pixel size. Ideally, it is desirable that signals output from the image pickup device be sampled by a sampling apparatus at an interval corresponding to the pixel size of the image pickup device.

Edge detection, a correlation method or the like is used for these sampled signals in order to measure the mark position.

Incidentally, in general, the accuracy required for the alignment sensor is extremely high in comparison to the minimum resolving unit of the image pickup device. For this reason, the position must be finally determined with an accuracy equal to or less than the sampled interval.

Heretofore, in edge detection and the correlation method, processing has been performed for the sampled signals, and when the final position result is calculated, the interval between the sampled points is fitted by an appropriate function such as a linear or a quadratic function, and by solving the function, a resolving power less than the sampled interval has been obtained. Typically, the finer the sampling interval, the more the accuracy is improved.

On the other hand, when the magnification of the optical system is increased in order to reduce the sampled interval on an object, the visual field is narrowed due to a limitation in the number of pixels of the CCD camera.

Considering the constitution of the apparatus, the visual field of the sensor must be ensured to some extent by conditions such as size of the alignment mark or the accuracy of the pre-alignment performed before the alignment measurement.

In addition, in order to prevent the conversion of a high-frequency component of a signal into a low-frequency component by sampling (aliasing), a necessary condition is that the minimum resolving unit of the image in the image pickup device is 0.5 times or less of the minimum periodic component.

The minimum periodic component of the signal is given by, for example, in the case of an image processing sensor using an optical microscope, the lower limit of the minimum periodic component of the image as $P_{min}$ as follows:

$$P_{min} = \lambda/(2 \times NA)$$

$\lambda$: wavelength of light
NA: NA of optical system

However, this value will also vary depending on the illumination conditions. By using this value, the sampling interval $P_s$ is given as:

$$P_s < 0.5 \times P_{min}$$

and, the above-described conditions can be satisfied.

However, when the sampling interval P, is increased, the error in sampling when performing the edge measurement or correlation measurement becomes significantly worse before the sampling interval $P_s$ reaches $0.5 \times P_{min}$, that is, from about $0.2 \times P_{min}$.

FIG. 14 is a diagram for explaining the process during the execution of the edge detection.

In a typical edge detection algorithm, first, the point of maximum inclination, slope point is found. Typically, since the sampling interval is a fixed value, a point is obtained where a difference $\Delta V$ between adjacent sampled points in the V direction in the drawing is at a maximum. In the example of FIG. 14, the point denoted by the reference symbol $P_0$ is the point of maximum inclination.

From this point, the closest relative maximum and minimum are found by hill-climbing and hill-descending. In the example shown in FIG. 14, with reference symbol $P_0$ as a center, points are found in the $H_1$ and $H_2$ directions where the difference $\Delta V$ in the V direction in the drawing becomes a minimum. These points are defined to be the maximum value and the minimum value of the edge. In the example of FIG. 14, the sampled point $P_1$ becomes the maximum value of the edge, and the sampled point $P_2$ becomes the minimum value of the edge.

After the maximum value and the minimum value of the edge are obtained, setting a slice level SL as, for example, an intermediate value of these values, the edge positions $E_1$ and $E_2$ are set as the points where the edge crosses the slice level.

When the sampling interval is increased to some extent, the maximum value and the minimum value of the above-described edge will vary according to the relationship between the sampled position and the signal edge position. For this reason, the slice level SL varies, resulting in a variation of the measurement result.

In addition, since the fitting is performed by a linear function, a quadratic function, or the like, when obtaining the edge positions $E_1$ and $E_2$, an error occurs here also.

Also in the correlation method, depending on the positional relationship between the sampled position and the signal, the mark signal causes deformation so as to change the center of gravity thereof, resulting in a variation in the measurement result.

Moreover, also in the correlation method, since a resolving power which is smaller than the sampled interval results from the fitting to a quadratic or the like, an interpolation error occurs here also.

Furthermore, heretofore, in order to improve the accuracy, a plurality of marks have been typically used for the alignment marks, and the accuracy has also been improved by averaging of the respective marks obtained by sampling in different phases.

Incidentally, when performing superposition by an exposure apparatus, a shift of the image according to the structure of the alignment mark and resulting from a comatic aberration becomes a problem. However, it has recently been found that the comatic aberration can be improved by increasing NA.

In addition, since the measurement accuracy improves as the edge slope becomes steeper for a signal which has a noise at the same level, it is also necessary to increase NA of the optical system used in the alignment in order to improve the alignment accuracy.

However, when NA of the alignment optical system is increased, a problem occurs in that the minimum periodic component $P_{min}$ included in the image, that is, $$P_{min} = \lambda/(2 \times NA)$$

decreases as NA increases.

Since it is difficult to narrow the visual field under the present situation, it has become difficult to satisfy the condition of $P_s < 0.2 \times P_{min}$.

In addition, in using an XY-simultaneous mark for measuring X and Y simultaneously in order to increase speed (refer to the gazette of Japanese Unexamined Patent Application, First Publication No. Hei 2-272305 for details), the number of alignment marks must be reduced, and thus the above-described averaging effect also decreases.

Hereinbelow, simulation results will be used to describe the relationship between the sampling interval and the position measurement error.

FIGS. 15 and 16 are diagrams showing position measurement errors when sampling is performed for a step difference mark of a 6 $\mu$m line for different sampling intervals. FIG. 15 is a diagram showing position measurement errors when imaging is performed with an optical system having a wavelength of 0.6 $\mu$m, an illumination sigma=1, and NA=0.6. FIG. 16 is a diagram showing position measurement errors when imaging is performed with an optical system having a wavelength of 0.6 $\mu$m, an illumination sigma=1 and NA=0.3. In FIGS. 15 and 16, the abscissa shows sampling intervals, and the ordinate shows position measurement errors.

In this simulation, the minimum periodic component $P_{min}$ included in the above-described image is 1 $\mu$m when NA is 0.3 and 0.5 $\mu$m when NA is 0.6.

As shown in FIGS. 15 and 16, when the sampling interval is changed, a result is obtained wherein the position measurement errors are cyclically reduced. However, this sampling interval in which the position measurement errors are reduced changes depending on the line width.

In alignment of the exposure apparatus and the like, the total required overlay (total overlay accuracy) also varies depending on the line width of the circuit pattern printed on the substrate. However, for this total overlay, typically an accuracy of ¼ or less of the minimum line width of the printed circuit pattern is required. An accuracy of about 50 nm is typically required for the total overlay. In order to satisfy this requirement, the measurement error allowable for the alignment sensor is about 3 to 5 nm.

Now, the alignment error allowable for alignment is assumed to be 5 nm.

As is apparent from FIGS. 15 and 16, even if NA is 0.6 and 0.3, when the sampling interval $P_s$ is $0.2 \times P_{min} < P_s < 0.39 \times P_{min}$, and when the sampling interval $P_s$ is $P_s > 0.41 \times P_{min}$, the point measurement error exceeds the allowable error.

FIG. 17 is a diagram showing the simulation results representing the relationship between the sampling interval and the position measurement error when a normalized mutual correlation is used.

As shown in FIG. 17, as the sampling interval $P_s$ becomes longer, the position measurement errors smoothly increase, and, with about $P_s < 0.2 \times P_{min}$ as a reference, the deterioration of the accuracy cannot be permitted.

Next, the results obtained by performing the edge detection with an increase in the number of alignment marks will be shown.

FIGS. 18 to 20 are diagrams showing the simulation results representing the relationship between the sampling interval and the position measurement error when the number of alignment marks is changed. FIG. 18 is a diagram showing the result when the number of line spaces (hereinafter referred to as L&S) is three; FIG. 19 is a diagram showing the result when L&S is six; and FIG. 20 is a diagram showing the result when L&S is nine.

In general, as the number of alignment marks is increased, the position measurement error decreases. However, from the results shown in FIGS. 18 to 20, it is understood that there is a sampling interval where the position measurement error does not decrease very much even if the number of alignment marks is increased.

Moreover, with reference to FIGS. 18 to 20, sampling intervals cyclically appear at which the position measurement errors are extremely reduced. The magnification of the optical system may be set so that the sampling interval thereof can be matched to the above-described sampling interval. However, this is not so desirable because the magnification accuracy during manufacturing needs to be made strict and different mark intervals cannot be dealt with.

DISCLOSURE OF THE INVENTION

The present invention was made in consideration of the foregoing circumstances in mind. The object of the present invention is to provide, even if a sampling interval must be set to about 0.2 times or more of the lower limit of the minimum periodic component, a mark detection method capable of reducing a position error of a mark position, an exposure method for transferring a predetermined pattern onto a substrate aligned using the mark detection method, a device manufacturing method using the exposure method, a mark detection apparatus, an exposure apparatus for transferring a predetermined pattern onto a substrate aligned using the mark detection apparatus, and a device manufactured by the use of the exposure apparatus.

Another object of the present invention is to provide, even if the sampling interval is equal to 0.5 times or more of the lower limit of the minimum periodic component, that is, even if the sampling interval does not satisfy a sampling theorem, a mark detection method capable of preventing a position measurement error caused by aliasing, an exposure method for transferring a predetermined pattern onto a substrate aligned using the mark detection method, a device manufacturing method using the exposure method, a mark detection apparatus, an exposure apparatus for transferring a predetermined pattern onto a substrate aligned using the mark detection apparatus and a device manufactured using the exposure apparatus.

In order to accomplish the foregoing objects, a first mark detection method of the present invention comprises the steps of: irradiating a mark formed on an object with a detection beam; imaging an image of the mark through an image-forming system; converting the image of the mark which is formed on an image pickup device into an electrical image signal; outputting a signal related to the image signal in a predetermined sampling interval; and interpolating the signals related to the image signal in cycles equal to or less than the predetermined sampling intervals.

According to this invention, in the case where the minimum resolution unit of an image pickup device must be 0.2 times the minimum periodic component of an image or more, there is an advantage that the position measurement error of a mark can be significantly reduced by interpolating in a cycle equal to or less than a predetermined sampling interval for image signals of the mark which are sampled at the predetermined intervals.

In addition, in the above-described mark detection method, the image pickup device has a predetermined pixel size, the predetermined sampling interval includes an interval of the predetermined pixel size, and the interpolation is performed at an interval equal to or less than the predetermined pixel size. In this case, the pixel size is preferably a predetermined multiple of the minimum periodic component of the image formed on the image pickup device. This minimum periodic component is defined by $\lambda/2NA$ based on the wavelength $\lambda$ of the detection beam and the numerical aperture NA of the imaging system. Moreover, it is preferable that the pixel size be 0.2 times the minimum periodic component or more and, further, 0.5 times the minimum periodic component or less. In this case, it is best if the pixel size is anywhere between 0.39 times or more to 0.41 times or less of the minimum periodic component. Moreover, it is preferable to perform a smoothing operation to remove a component equal to or less than a predetermined cycle from the image signal output at the sampling intervals.

Furthermore, it is preferable that the smoothing operation remove a periodic component equal to or less than $1/(1/P_s - 1/P_{min})$, which is represented by the predetermined pixel size $P_s$ and the minimum periodic component $P_{min}$.

By performing this processing, aliasing noise can be removed in the case where the minimum resolving unit $P_s$ of the image pickup device must be 0.5 times or more of the minimum periodic component $P_{min}$ of the image; thus there is an advantage that error accuracy can be improved even in conditions where the image of an object cannot be completely restored.

As a result, since the position measurement in a coarse sampling interval can be performed on, for example, the image of the alignment mark, the expansion of NA or the expansion of the visual field is possible even by the use of a conventional image pickup device.

Moreover, since an interpolation operation accompanied with smoothing is performed in this invention, there is an advantage in that processing time can be shortened as compared with the case where interpolation and low pass filtering are performed separately.

Furthermore, the predetermined pixel size $P_s$ is preferably more than 0.5 times the minimum periodic component $P_{min}$.

Specifically, the smoothing operation comprises: a step of setting a smoothing point where smoothing is performed for the image signal; a step of selecting, from the image signal, an image signal sampled in a predetermined range that includes the smoothing point; a step of sampling a function while removing a periodic component smaller than $1/(1/P_s - 1/P_{min})$ according to the distance between the position of the smoothing point and a position of the selected image signal in a cycle identical to the sampling interval of the image signal; and a step of adding the product of the selected image signal and the sampled function, the product being obtained for each of the image signals included in the predetermined range. Alternatively, the smoothing operation comprises: a step of setting an interpolation point where the interpolation for the image signal is to be performed; a step of obtaining a most proximate position of the image signal, which is most proximate to the position of the interpolation point; a step of selecting, from the image signal, an image signal sampled in a predetermined range including the most proximate position; and a step of adding the product of the selected image signal and the function removing a periodic component smaller than $1/(1/P_s-1/P_{min})$ according to the distance from the position of the selected image signal, the product being obtained for each of the image signals included in the predetermined range.

Moreover, in this invention, the image signal is output as a sample point in the predetermined sampling interval, and an interpolation is performed on an arbitrary point in a cycle equal to or less than the predetermined sampling interval by an interpolation method using a conversion including the linear combination of a plurality of the sample points located in the vicinity of the arbitrary point. This interpolation method includes a weighting operation using the plurality of the sample points.

Furthermore, in this invention, the position of the object is measured on the basis of the interpolated image signal. Herein, the predetermined sampling interval is determined on the basis of the amount of position measurement error in the measurement. The object predetermined herein is a substrate onto which a circuit pattern is transferred, and the amount of position measurement error in the predetermined sampling interval is the value where a total overlay becomes ¼ or less of the minimum line width of the circuit pattern transferred onto the substrate.

Still further, in this invention, the interpolation is performed on the image signal itself and on a correlation function obtained on the basis of the image signal.

In order to accomplish the foregoing objects, a second mark detection method of the present invention comprises the steps of: imaging a mark formed on an object; converting an image of the mark, which is formed on an image pickup device, into an electrical image signal; outputting a signal related to the image signal in a predetermined sampling interval as a sample point; and performing an interpolation on an arbitrary point in a cycle equal to or less than the predetermined sampling interval by an interpolation method using a conversion including the linear combination of a plurality of the sample points.

Herein, in the interpolation method, the arbitrary point is subjected to interpolation using the plurality of the sample points located in the vicinity of the arbitrary point. This interpolation method includes a step of performing a weighting operation using the plurality of the sample points, and an interpolation filter for determining a weighting coefficient used in the weighting operation. Herein, when the predetermined sampling interval is T, the interpolation filter includes an interpolation function s(dx) given by as:

$$s(dx) = \frac{\sin(2\pi dx/2T)}{2\pi dx/2T}$$

The interpolation filter is represented as: $S(dx)=s(dx)\cdot W(dx)$. S is a product of the interpolation function s(dx) and a window function W(dx) which is capable of converging an end portion of the interpolation function s(dx) to zero. Herein, when a length of the window is R, the window function W(dx) is represented as:

$$W(dx) = \frac{1+\cos(2\pi dx/R)}{2}$$

Moreover, the second mark detection method of the present invention standardizes the interpolation filter so that the sum total of the weighting coefficients used when a first arbitrary point is subjected to interpolation and the sum total of the weighting coefficients used when a second arbitrary point different from the first arbitrary point is subjected to interpolation can be predetermined values. Herein, the standardization converts the respective coefficients of the interpolation filter by dividing the respective coefficients by the sum total of the respective coefficients.

Furthermore, the second mark detection method of the present invention performs a smoothing process for removing a component having a cycle equal to or less than a predetermined cycle from the image signal output as a sample point in the predetermined sampling interval. Herein, the image pickup device has a pixel size $P_s$ a predetermined multiple of the minimum periodic component $P_{min}$ of the image formed on the image pickup device. The smoothing process includes a step of removing a periodic component equal to or less than $1/(1/P_s-1/P_{min})$, on the basis of the pixel size $P_s$ and the minimum periodic component $P_{min}$. The pixel size $P_s$ is larger than 0.5 times the minimum periodic component $P_{min}$.

Furthermore, the interpolation is performed on the image signal itself.

The exposure method of the present invention is characterized in that the object is a substrate onto which a predetermined pattern is transferred, and the predetermined pattern is transferred onto the substrate which is aligned on the basis of the mark detected by the use of the mark detection method.

Moreover, a device manufacturing method of the present invention is for manufacturing a device using the exposure method of transferring the predetermined pattern onto the substrate.

A first mark detection apparatus of the present invention includes an irradiation system which irradiates a mark formed on an object with a detection beam, an image-forming system which forms an image of the mark on the image-forming surface, and an image pickup device disposed above the image-forming surface, a sampling device which converts the image of the mark into an electrical image signal in order to output a signal related to the image signal in a predetermined sampling interval, and an interpolation device which interpolates the signal related to the image signal in a cycle equal to or less than the predetermined sampling interval.

Herein, the first mark detection apparatus of the present invention is characterized in that the image pickup device has a pixel size a predetermined multiple of the minimum periodic component of an image formed on the image-forming surface, the predetermined sampling interval includes a cycle of the pixel size, and the interpolation device performs an interpolation in a cycle equal to or less than the pixel size. The minimum periodic component is defined by λ/2NA based on the wavelength λ of the detection beam and the numerical aperture NA of the image-forming system. The pixel size is preferably 0.2 to 0.5 times the minimum periodic component. In addition, the first mark detection apparatus of the present invention further comprises a smoothing device which removes a component equal to or less than a predetermined cycle from a signal output at the sampling intervals by the sampling device.

Herein, the pixel size $P_s$ is larger than 0.5 times the minimum periodic component $P_{min}$, and the smoothing device removes periodic components equal to or less than $1/(1/P_s-1/P_{min})$, on the basis of the pixel size $P_s$ and the minimum periodic component $P_{min}$.

Moreover, the first mark detection apparatus of the present invention is characterized in that the sampling device outputs a signal related to the image signal as a sample point in the predetermined sampling interval, and the interpolation device interpolates an arbitrary point in a cycle equal to or less than the predetermined sampling interval by an interpolation method using a conversion including the linear combination of a plurality of the sample points located in the vicinity of the arbitrary point.

Furthermore, the first mark detection apparatus further comprises a measurement device which measures a position of the object on the basis of the interpolated signal, characterized in that the predetermined sampling interval is determined on the basis of the amount of position measurement error of the measurement by the measurement device.

Still further, the first mark detection apparatus is characterized in that the sampling device outputs the image signal itself in the predetermined sampling interval, and the interpolation device performs an interpolation on the image signal itself.

A second mark detection method of the present invention comprises a sampling device which images a mark formed on an object, converting an image of the mark into an electrical image signal and outputting a signal related to the image signal in a predetermined sampling interval as a sampling point; and an interpolating device which interpolates an arbitrary point in a cycle equal to or less than the predetermined sampling interval by an interpolation method using a conversion including the linear combination of a plurality of the sample points. Herein, the interpolation device interpolates the arbitrary point using the plurality of the sample points located in the vicinity of the arbitrary point, and the interpolation device performs a weighting operation using the plurality of the sample points, and includes an interpolation filer which determines a weighting coefficient used in the weighting operation. When the predetermined sampling interval is T, this interpolation filter includes an interpolation function s(dx) represented as:

$$s(dx) = \frac{\sin(2\pi dx/2T)}{2\pi dx/2T}$$

Moreover, the first mark detection apparatus of the present invention further comprises a standardizing device which standardizes the interpolation filter so that the sum total of the weighting coefficients used when interpolation is performed on a first arbitrary point and the sum total of weighting coefficients used when interpolation is performed on a second arbitrary point different from the first arbitrary point can be predetermined values. This standardizing device converts the respective coefficients of the interpolation filter by dividing the respective coefficients by the sum total of the respective coefficients.

Furthermore, the first mark detection apparatus of the present invention further comprises a smoothing device which removes a component equal to or less than a predetermined cycle from the signal output as a sample point in the predetermined sampling interval by the sampling device. Herein, the sampling device includes an image pickup device having a pixel size $P_s$ of a predetermined multiple of the minimum periodic component $P_{min}$ of an image formed on a predetermined image-forming surface, and the smoothing device removes a periodic component equal to or less than $1/(1/P_s-1/P_{min})$, on the basis of the pixel size $P_s$ and the minimum periodic component $P_{min}$. This pixel size $P_s$ is preferably larger than 0.5 times the minimum periodic component $P_{min}$.

In addition, the second mark detection apparatus of the present invention is characterized in that the sampling device outputs the image signal itself in the predetermined sampling interval, and the interpolation device performs an interpolation on the image signal itself.

The exposure apparatus of the present invention is characterized in that the object is a substrate onto which a predetermined pattern is transferred, and the predetermined pattern is transferred onto the substrate which is aligned on the basis of the mark detected by the use of the mark detection apparatus.

Furthermore, a device of the present invention is manufactured through the step of transferring the predetermined pattern onto the substrate by the exposure apparatus.

BEST MODE FOR CARRYING OUT THE INVENTION

Hereinbelow, a description will be made in detail for a mark detection method, an exposure method, a device manufacturing method, a mark detection apparatus, and an exposure apparatus according to one embodiment of the present invention with reference to the drawings.

Exposure Apparatus

First, a description according to one embodiment of the present invention will be made for an exposure apparatus, to which a mark detection method according to one embodiment of the present invention is applied.

Figure 1:
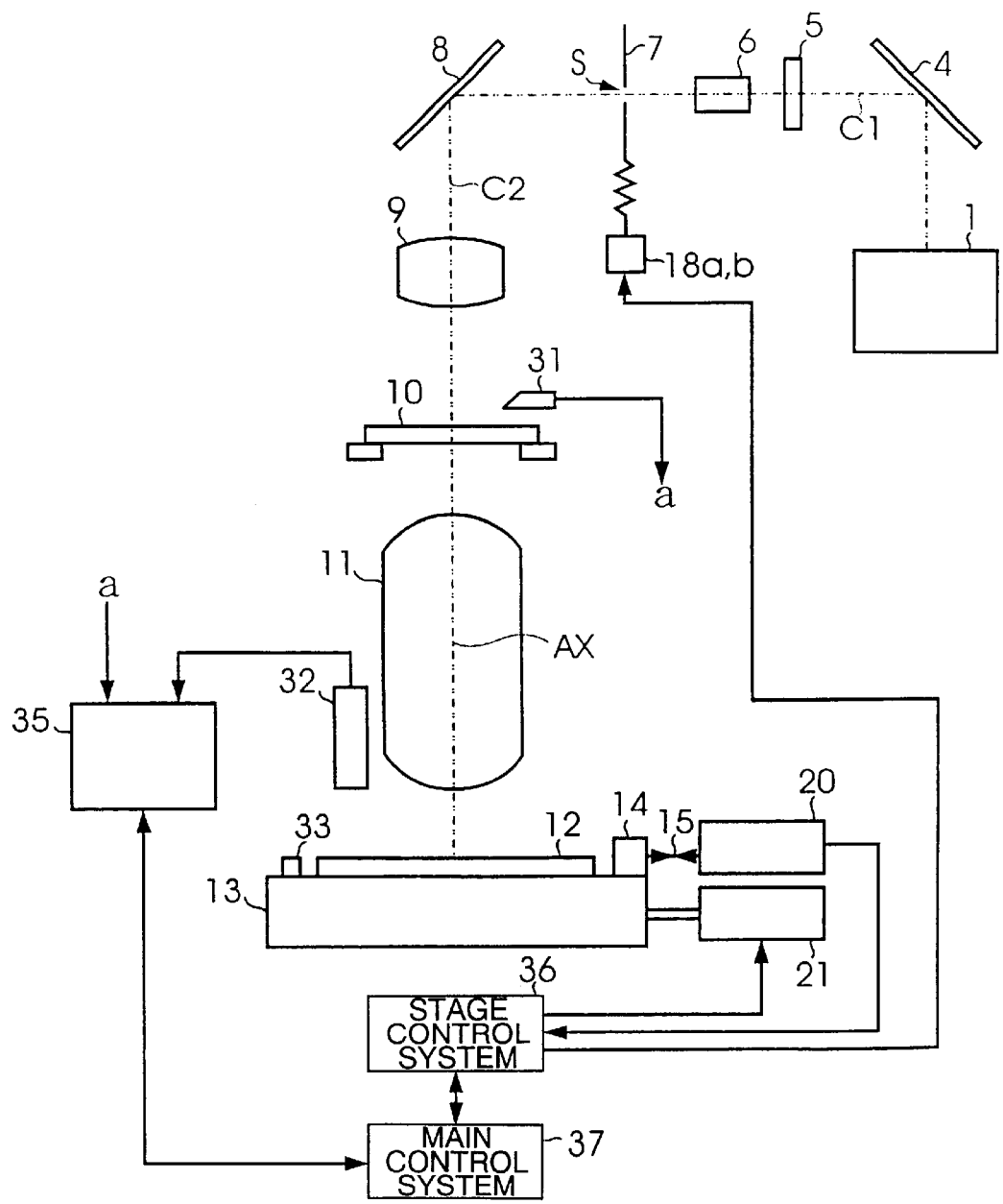
FIG. 1 is a diagram schematically showing a constitution of an exposure apparatus of one embodiment of the present invention.

FIG. 1 is a diagram schematically showing a constitution of the exposure apparatus according to one embodiment of the present invention.

In FIG. 1, reference numeral 1 denotes a light source such as a super-high-pressure mercury lamp or an excimer laser. Reference numeral 4 denotes a reflection mirror for reflecting illumination light emitted from light source 1. Reference numeral 5 denotes a wavelength selection filter which only transmits light having a wavelength necessary for exposure therethrough. Reference numeral 6 denotes a fly-eye integrator 6 which adjusts the illumination light transmitted through wavelength selection filter 5 into a luminous flux having a uniform intensity distribution.

Reference numeral 7 denotes a reticle blind having an aperture S, which adjusts the illumination range of the illumination light for a reticle 10, to be described later, by changing the size of aperture S.

Wavelength selection filter 5, fly-eye integrator 6 and reticle blind 7 are disposed sequentially on the same optical axis C1.

Reference numeral 8 denotes a reflection mirror for bending the optical axis C1, and reference numeral 9 denotes a lens system for irradiating a reticle with the illumination light reflected by reflection mirror 8.

Reticle 10 is disposed on an optical axis C2 where lens system 9 is disposed. On this reticle 10, a shot pattern is transferred onto a wafer 12 and an alignment mark for position measurement, which are to be described later.

Reference numeral 11 denotes a projection optical system disposed on optical axis C2, which converges the illumination light transmitted through reticle 10.

Wafer 12 is a semiconductor substrate made of silicon or the like, and resist (not shown) is coated on a surface thereof.

Reference numeral 13 denotes a stage for holding wafer 12 by vacuum suction. In addition, the stage 13 has a known structure in which a pair of blocks movable in directions perpendicular to each other are superposed onto each other. Reference numeral 21 denotes a drive device such as a motor, which moves stage 13 in a stage-moving coordinate system formed in directions perpendicular to each other. Therefore, drive device 21 moves stage 13, and thus the shot position on wafer 12 is superposed on an exposure visual field of projection optical system 1.

In addition, a moving mirror 14 is fixed on a predetermined position of stage 13. Reference numeral 20 denotes a laser interferometer which detects the position of stage 13 in the stage-moving coordinate system by irradiating moving mirror 14 disposed on stage 13 with a laser beam 15.

The above-described drive device 21 and laser interferometer 20 are controlled by a stage control system 36.

In addition, a reference mark member 33 having a height equal to the surface of wafer 12 is fixed on a predetermined position of stage 13. On a surface of reference mark member 33, a mark as a reference for alignment is formed. By measuring this mark, a reference position of the alignment sensor can be determined, and a positional relation between stage 13 and reticle 10 can be measured.

Stage control system 36 controls drive device 21 based on a control signal output from a main control system 37 to control movement of stage 13.

In addition, detection results of laser interferometer 20 are supplied from stage control system 36 to main control system 37, and main control system 37 outputs a control signal to stage control system 36 based on the information of the results.

The exposure apparatus in this embodiment comprises: a reticle alignment sensor 31 for detecting an alignment mark formed on reticle 10; and a wafer alignment sensor 32 for detecting a reference mark on reference mark member 33 or an alignment mark formed on wafer 12.

Reticle alignment sensor 31 detects the alignment mark of reticle 10 by the use of, for example, light (detection beam) having a wavelength equal to that of the illumination light (exposure light) from a light source (irradiation system, not shown). The relative position of a detection origin (for example, the center of an index mark) of reticle alignment sensor 31 and an optical axis AX of the projection optical system are obtained beforehand. And the relative position of the center of a circuit pattern region drawn on the reticle and the alignment mark is also obtained beforehand. Accordingly, the center of the circuit pattern of the reticle and optical axis AX of the projection optical system can be aligned by detecting the alignment mark and by obtaining an amount of a shift thereof from the detection origin.

Wafer alignment sensor 32 is a so-called off-axis alignment sensor which is separately provided outside projection optical system 11. On an image projection surface, the optical axis of wafer alignment sensor 32 and the optical axis of projection optical system 11 are parallel to each other. Wafer alignment sensor 32 detects the reference mark provided on reference mark member 33 or the alignment mark formed on wafer 12, and thus measures the relative positional relation between these detected marks and the index mark formed in alignment sensor 32. Note that the reference mark or the alignment mark is irradiated with the detection beam from a light source (irradiation system) which is not shown.

Reticle alignment sensor 31 and Wafer alignment sensor 32 comprise image-forming systems which form images of the alignment mark and the reference mark and the like on an image pickup device.

In addition, although all types of the above-described sensors are applicable as wafer alignment sensor 32, an example of this embodiment will be described using an FIA alignment sensor as wafer alignment sensor 32.

Reference numeral 35 denotes an alignment control system to which reticle alignment sensor 31 and the wafer alignment sensor 32 are connected. Alignment control system 35 processes alignment signals output from alignment sensors 31 and 32, and outputs the same to the above-described main control system 37.

In the foregoing constitution, the illumination light emitted from light source 1, such as a super-high-pressure mercury lamp or an excimer laser, is reflected by reflection mirror 4 and incident on wavelength selection filter 5. Wavelength selection filter 5 only transmits light having a wavelength necessary for exposure therethrough, and the illumination light transmitted through wavelength selection filter 5 is adjusted into a luminous flux having a uniform intensity distribution by fly-eye integrator 6 and then reaches reticle blind 7.

Reticle blind 7 changes the size of aperture S to adjust the illumination range on reticle 10 by the illumination light. The illumination light transmitted through aperture S of reticle blind 7 is reflected by reflection mirror 8 and incident on lens system 9. The image of aperture S of reticle blind 7 is formed on reticle 10 by this lens system 9, and the desired range of reticle 10 is illuminated.

The image of the shot pattern or the alignment mark, which exists in the illumination range of the reticle 10, is formed on wafer 12 coated with resist by projection optical system 11, and thus the pattern image of reticle 10 is exposed on a particular region of wafer 12.

Reticle alignment sensor 31 detects the position of the alignment mark formed on reticle 10, and wafer alignment sensor 32 detects the reference mark position on reference mark member 33 fixed on stage 13, and thus the alignment signal is output. This alignment signal is output to alignment control system 35, and reference positions of reticle 10 and stage 13 are set.

Next, main control system 37 outputs a control signal to stage control system 36 so that the alignment mark formed on wafer 12 can be detected by the wafer alignment sensor 32. Stage control system 36 drives stage 13 on the basis of this control signal, supplies a detection signal output from laser interferometer 20 to main control system 37, and controls the detection signal by sending feedback to it.

In such a manner, main control system 37 controls and moves stage 13, measures the position of the alignment mark formed on wafer 12, measures the positions of reticle 10 and wafer 12, and performs an alignment for the same. At the point when the alignment is terminated, the shot pattern formed on reticle 10 is transferred to the resist coated on wafer 12.

A description will be made in detail of the procedure for determining an alignment mark position from the alignment signals output from reticle alignment sensor 31 and wafer alignment sensor 32.

It is effective to perform the interpolation of the minimum division unit of the image pickup device if it is 0.2 to 0.5 times the minimum periodic component of the image formed on the image pickup device by the alignment optical system.

The mark image formed on the image pickup device is sent as an electrical signal to a sampling apparatus which is a sampling device, and sent as a digital image signal to a processing system. This processing system constitutes an interpolation device, a smoothing device, a standardizing device and a measurement device.

A line sensor, a CCD camera or the like can be used as the image pickup device. In the former case, the digital image signal is one-dimensional, and in the latter case, two-dimensional.

In addition, it is desirable that the sampling interval for the digital image signal output from the sampling apparatus typically be made to correspond with the minimum division unit of the image pickup device. In such a manner, the resolving power of the image pickup device can be efficiently utilized.

Mark Detection Method

Next, a description will be made in detail of a mark detection method according to one embodiment of the present invention.

Interpolation of an Image Signal

First, a description will be made of a method for performing an interpolation of a digital image signal obtained by the foregoing image pickup device.

To simplify the description, the case of a one-dimensional image will be described. Even a two-dimensional image can be treated as a one-dimensional image by removing one scanning line or by adding scanning lines in one direction.

Figure 2:
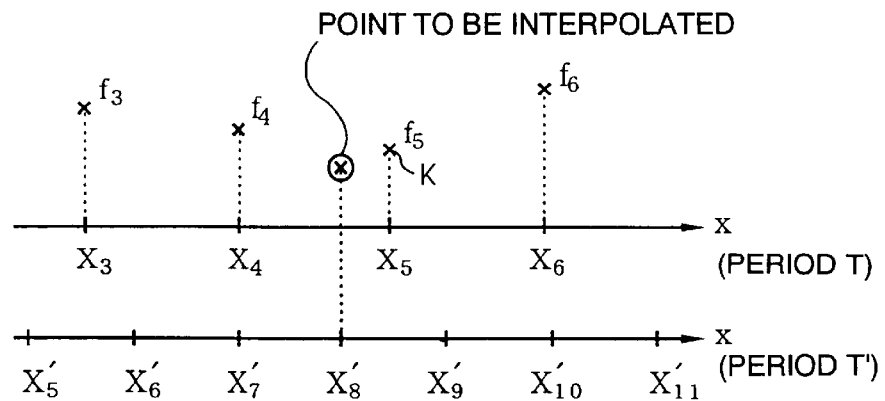
FIG. 2 is a diagram for explaining a state in which interpolation is performed on a one-dimensional image.

FIG. 2 is a diagram for explaining a state in which interpolation is performed on a one-dimensional image. In FIG. 2, for simplicity, a description will be made for the case of an interpolation where an image is treated as a one-dimensional image.

A case is considered in which interpolation is performed on a one-dimensional digital image signal $f_k(k:0, 1, \ldots, n)$ having a sampling interval T in a cycle T' satisfying T'<T. The signal after being subjected to interpolation is defined to be $f'_{k'}(k':0, 1, \ldots, n')$. In order to perform the interpolation, it is satisfactory that a convolution operation is performed using an interpolation filter S(k, k') by the use of a point K, where a position X(k) on a digital image indicated by k and a position X'(k') indicated by k' are coincident with each other or proximate to each other (hereinafter, referred to as a proximate point), and several points in front of and behind this point.

A description will be made more specifically with reference to FIG. 2. In FIG. 2, $f_3$ to $f_6$ denote one-dimensional digital image signals, each having a sampling interval T. The position coordinates of these one-dimensional digital image signals $f_3$ to $f_6$ are $X_3$ to $X_6$, respectively.

Now, the case is considered in which the interpolation is performed on these one-dimensional digital image signals in the cycle T'. In the case where the interpolation is performed between the one-dimensional digital image signals $f_4$ and $f_5$, the signal after the interpolation is defined to be $f'_8$ and the position coordinate thereof is defined to be $X'_8$.

A one-dimensional digital image signal proximate to the position coordinate of the signal after the interpolation is $f_5$.

This one-dimensional digital image signal $f_5$ corresponds to the proximate point K, which has a value of K=5.

Therefore, the interpolation is performed by the use of several points in front of and behind the proximate point K, for example, using the one-dimensional digital image signals $f_4$ and $f_5$ and the following Equation (1):

$$f'k' = \sum_{(K-m \leq k \leq K+m)} f_{k_4} S(k, k') \qquad (1)$$

In the foregoing Equation (1), the interpolation filter S(k, k') is a function of k and k' in general; however, in the case of performing a position measurement, the interpolation filter S(dx), which depends only on the relative position dx=|X(k)−X(k')|, is typically used.

Moreover, when the sampling intervals T and T' are in an integer ratio, the values that the relative position dx can take are limited. All of these numerical values are stored beforehand held in a storage apparatus and by reading these numerical values from the storage apparatus during the interpolation, the interpolation operation can be performed. Note that the variable "m" used in Equation (1) is a variable determined in consideration of the accuracy of the interpolation and the like.

Furthermore, in FIG. 2, in the case of obtaining $f_7$, since the position coordinate of $X'_7$ and the position coordinate $X_4$ of the one-dimensional digital image signal $f_4$ are the same, $f_4$ corresponds to the proximate point K and the value thereof is K=4.

When a sampling function represented by Equation (2) is used as the foregoing interpolation filter S(dx), the original signal can theoretically be restored.

$$S(dx) = \frac{\sin(2\pi dx/2T)}{2\pi dx/2T} \qquad (2)$$

However, an errors occurs which is attributable to the area of the pixel of the image pickup device and the use of only data adjacent to the signal in the interpolation.

The error caused by the latter case noticeably appears when the interpolation filter S(dx) does not smoothly converge to zero at the end portions thereof.

For this reason, in actually, the product of the interpolation filter S(dx) having a limited length and the length itself, that is, a window function W(dx) matching the distance fixed by the variable m considered in performing the interpolation, is used as the interpolation filter S(dx). The following Equation (3) is an equation representing this interpolation filter S(dx).

$$S(dx) = \frac{\sin(2\pi dx/2T)}{2\pi dx/2T} \times W(dx) \qquad (3)$$

As an example of the foregoing window function, a panning window or the like represented by the following Equation (4) may be satisfactorily used.

$$W(dx) = \frac{1 + \cos(2\pi dx/R)}{2} \qquad (4)$$

R: range and length of the window

In the above-described method, for the case where the position coordinate X(k') is coincident with the position coordinate X(k), all of the points become zero except for the point where the relative position dx=0. Accordingly, the data prior to the interpolation may be used as it is for the relative position, and thus the processing speed may be increased.

In addition, although in the above description, the case was described wherein an image signal obtained from the image pickup device is handled as a one-dimensional image, the processing can be performed for the case wherein an image signal is handled as a two-dimensional image.

Removal of Noise

Moreover, there are many cases where noise is included in the image signal which is a processing object. This noise is electrical noise generated on the periphery of the image signal or a defect, such as dust or the like, caused when the alignment mark is subjected to processing.

Particularly, in the case of performing asymptotic processing such as edge detection, high-frequency noise causes detection errors and the like, resulting in large measurement error.

For this reason, in the case of performing a position measurement, in general, low-pass filtering is commonly performed.

As described above, the interpolation is performed on the image signal obtained in this embodiment, and thereafter, in the case of filtering, the filtering is performed at the sampling intervals after the interpolation. When the interpolation is performed, the sampling interval after the interpolation becomes shorter than the sampling interval for the image signal. Accordingly, in the case where the filtering is performed after the interpolation, many operations are required and the processing time increases.

Furthermore, although the filtering can be performed before the interpolation, in this case, the process of filtering becomes noise in the interpolation operation, resulting in a deterioration of the accuracy.

However, the interpolation operation as described above is a convolution operation which is basically the same as the filtering operation. Therefore, it is considered that the deterioration of the accuracy is prevented by simultaneously performing the interpolation operation, and that the filtering operation and the processing speed can be increased.

Now, a predetermined low-pass filter is assumed to be R(x).

In the case of performing low-pass filtering after the interpolation is performed using the interpolation filter S(x) represented in the above-described Equation (2) or (3), first, the processing is performed on the image signal using the interpolation filter S(x), and then the processing is performed using the low-pass filter R(x).

Although not equivalently to the above process, when the following Equation (5) is used, an almost similar process can be performed.

$$LPS(x) = \int S(x') * R(x-x') dx' \qquad (5)$$

Therefore, the image signal obtained from the image pickup device is processed by the use of LPS(x) represented in Equation (5), and thus a signal subjected to interpolation and filtering can be obtained; and since these processes are performed simultaneously, the processing time can be shortened.

An operation for the case where a sinc function is used as the above-described low-pass filter, R(x) corresponds to a change of the cycle of the sinc function of the interpolation filter S(x) represented by Equation (2).

Accordingly, in this case, LPS(x) in Equation (5) can be represented as in the following Equation (6) by the use of a variable H satisfying H<T.

$$LPS(dx) = \frac{\sin(2\pi dx/2H)}{2\pi dx/2H} \qquad (6)$$

Moreover, in the case of using the window function W(dx) represented in Equation (3), LPS(dx) is represented as in the following equation (7).

$$LPS(dx) = \frac{\sin(2\pi dx/2H)}{2\pi dx/2H} \times W(dx) \qquad (7)$$

By using Equation (6) or (7) in the processing of the image signal obtained from the image pickup device, the interpolation and low-pass filtering can be performed at a higher rate.

The foregoing window function is represented by the following Equation (8).

$$W(dx) = \frac{1 + \cos(2\pi dx/R)}{2} \qquad (8)$$

R: range and length of the window

Interpolation of a Two-dimensional Image Signal

Next, a description will be made in detail for the case where the image signal obtained from the image pickup device is a two-dimensional image.

In the case of performing position measurement using a two-dimensional image, position coordinates in two directions may be obtained from the same image data, or a position coordinate in only one direction may be obtained.

In this embodiment, for the case where the minimum division unit of the image pickup device is about 0.2 times the minimum periodic component of an image in at least one measurement direction, the interpolation is performed so that the sampling interval of the digital image can be smaller than the minimum division unit of the image pickup device at least in this direction.

A case is considered wherein the interpolation is performed on a two-dimensional image signal $f_{kx, ky}$ (sampling interval $T_x$ in the x direction, sampling interval $T_y$ in the y direction) and the two-dimensional image signal $f_{kx, ky}$ is converted into a signal $f_{kx', ky'}$(kx':0, 1, . . . , nx'; ky':0, 1, . . . , ny') sampled in a cycle $T_x'$ and $T_y'$ satisfying at least one of $T_x>T_x'$ and $T_y>T_y'$.

After interpolation, each value of the image signal $f_{kx', ky'}$ is obtained by the following Equation (9) using signals $f_{kx, ky}$ of one or more limited close points ($P_x$-mx<kx<$P_x$+nx, $P_y$-my<ky<$P_y$+ny) and an arbitrary interpolation filter S(kx, kx', ky, ky') depending on k and k', with a point ($P_x$, $P_y$) as a center, wherein a position $P_x$(kx), $P_y$(ky) on a two-dimensional image corresponding to kx, ky, and a position $P_x'$(kx'), $P_y'$(ky') corresponding to kx', ky' are coincident or proximate to each other. Note that the foregoing variable m is a variable set in relation to the accuracy.

$$f'_{k'} = \sum_{\substack{(Px-mx<kx<Px+nx) \\ (Py-my<ky<Py+nx)}} f_{k_1} S(kx, kx', ky, ky') \qquad (9)$$

In order to facilitate understanding regarding the above-described process, a specific example will be described with reference to FIG. 3.

Figure 3:
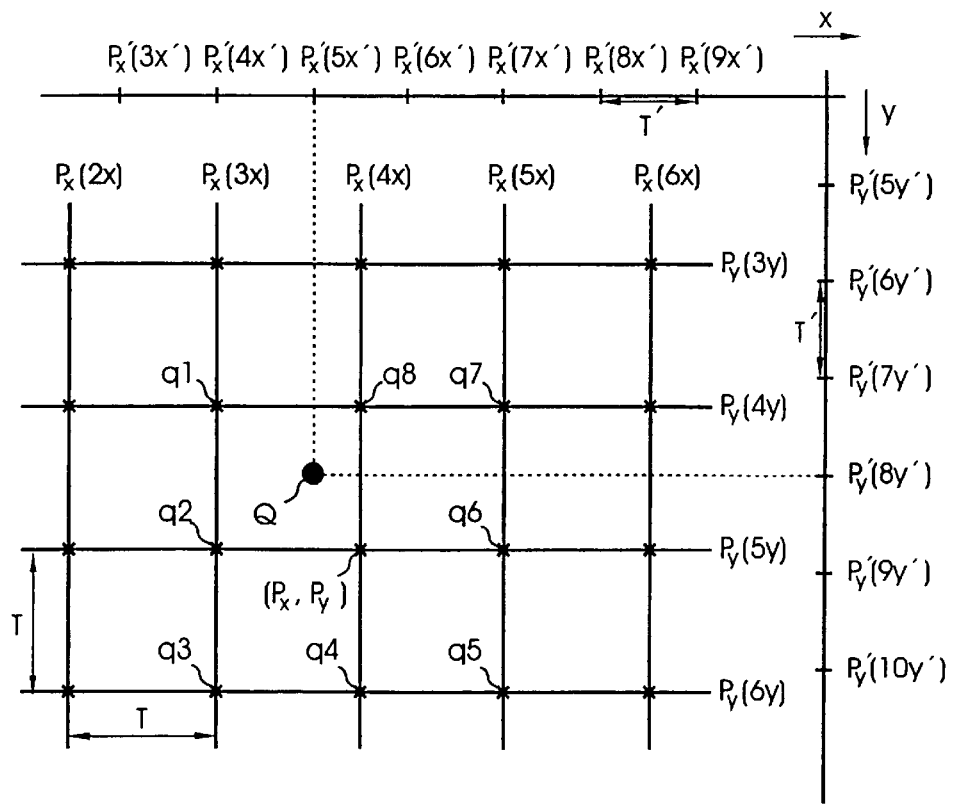
FIG. 3 is a diagram for explaining a state in which interpolation is performed on a two-dimensional image signal.

FIG. 3 is a diagram for explaining a state in which the interpolation is performed on a two-dimensional image signal. In FIG. 3, to simplify the explanation, a case will be described wherein the sampling intervals of the two-dimensional image in two directions (x direction and y direction in FIG. 3) have the same T.

In FIG. 3, ($P_x$(2x), $P_y$(3y)) to ($P_x$(6x), $P_y$(6y)) are assumed to be points sampled by the image pickup device.

Now, the case is considered where the interpolation is performed a sampling interval T' satisfying T'<T. Note that, in order to facilitate understanding, the case will be described wherein the interpolation is performed at the sampling intervals T' in any of the x direction and the y direction.

As shown in FIG. 3, the sampled points after the interpolation are defined to be ($P_x'$(3x'), $P_y'$(5y')) to ($P_x'$(9x'), $P_y'$(10y')).

Now, the case is considered where the interpolation is performed for a point Q of ($P_x'$(5x'), $P_y'$(8y')) as shown in FIG. 3. First, a proximate point to the point Q to be interpolated (hereinafter, referred to as a proximate point) is obtained. In FIG. 3, ($P_x$(4x), $P_y$(5y)) becomes the proximate point.

Next, at least one of the close points of this proximate point is selected. In the example shown in FIG. 3, points q1 to q8 are selected. After selecting these close points, the operation represented by the foregoing Equation (9) is performed.

The interpolation filter S(kx, kx', ky, ky') is a function depending on the position in the two-dimensional image signal shown by k and the position shown by k', similar to the case where the interpolation is performed on the one-dimensional image signal. In many cases, the interpolation on the two-dimensional image signal is represented using the difference of these positions.

For the case where the distance of these positions in the x direction is defined to be dx=|$P_x$(kx)-$P_x'$(kx')| and the distance thereof in the y direction is defined to be dy=|$P_y$(ky)-$P_y'$(ky')|, the foregoing interpolation filter S(kx, kx', ky, ky') is represented as the interpolation filter S(dx, dy).

Moreover, the following is also similar to the case where the interpolation is performed on the one-dimensional image signal. Specifically, if the sampling interval T and the sampling interval T' are in an integer ratio, when the operation of the foregoing Equation (9) is executed, the values of all the interpolation filters S(dx, dy) that the above-described variable can take are stored beforehand in the storage apparatus and can be read while performing the interpolation operation.

The interpolation filter S(dx, dy), for the case of performing the interpolation on the two-dimensional image signal, becomes a product of interpolation filters $s_x$ and $s_y$ in their respective directions and is represented by the following Equation (10).

$$S(dx,dy) = s_x(dx) \times s_y(dy) \qquad (10)$$

where $$s_x(dx) = \frac{\sin(2\pi dx/2T_x)}{2\pi dx/2T_x}$$

$$s_y(dy) = \frac{\sin(2\pi dy/2T_y)}{2\pi dy/2T_y}$$

The window function, for reducing noise due to the fact that the interpolation filters $s_x$ and $s_y$ are limited filters, and the filtering, for allowing the interpolation filters $s_x$ and $s_y$ to have a low-pass effect or the like, are enabled in a manner similar to the case of the one-dimensional image signal when each of all of the interpolation filters $s_x(dx)$ and $s_y(dy)$ is subjected to the window function and the low-pass filtering, and then a product thereof is used.

Moreover, similar to the case of performing noise removal for the one-dimensional image signal, with the interpolation filters $s_x(dx)$ and $s_y(dy)$ represented in Equation (10), $H_x$ and $H_y$ satisfying a sampling interval of $H_x<T_x$, $H_y<T_y$ are used to convert Equation (10) into the following Equation (11), and thus low-pass filtering and interpolation can be performed simultaneously.

$$s_x(dx) = \frac{\sin(2\pi dx/2H_x)}{2\pi dx/2H_x} \quad (11)$$

$$s_y(dy) = \frac{\sin(2\pi dy/2H_y)}{2\pi dy/2H_y}$$

Furthermore, by obtaining a product of S(dx, dy) in Equation (10) and the window function W(dx, dy), a deficiency wherein the value does not smoothly converge to zero at the end portion of the interpolation filter during noise removal may be resolved.

One example of the foregoing window function W(dx, dy) is given by the following Equation (12).

$$W(dx, dy) = w_x(dx) \times w_y(dx) \quad (12)$$

where $$w_x(dx) = \frac{1 + \cos(2\pi dx/R_x)}{2}$$

$$w_y(dy) = \frac{1 + \cos(2\pi dy/R_y)}{2}$$

Rx: range and length of the window in the x direction

Ry: range and length of the window in the y direction

Elimination of Aliasing (Smoothing)

In general, in order to obtain an original image from a signal obtained by sampling after performing the sampling for a certain image, the sampling interval must be 0.5 times or less than the minimum cycle included in the image. Herein, for the case where the wavelength of light used for the illumination is λ and the numerical aperture of the optical system is NA, the minimum periodic component of the optical system is λ/(2×NA).

However, in order that the alignment mark is first detected in the exposure apparatus, the magnification of the optical system is reduced to make the visual field broader. After the alignment mark is detected, the magnification of the optical system is increased and the alignment is performed.

In such a case, the minimum division unit of the image pickup device sometimes becomes 0.5 times or more of the minimum periodic component of the image formed on the image pickup device by the alignment optical system. Hereinbelow, a description will be made for a mark detection method capable of reducing the position measurement error even in such a case.

For the case where the foregoing conditions are not satisfied, for sampling performed by the image pickup device, aliasing occurs wherein a short periodic component of the image is converted into a long periodic component. For this reason, there is a problem that, in principle, a signal cannot be restored only by performing the interpolation.

In this embodiment, a pseudo-signal component due to aliasing is included in the signal and then removed.

When the minimum periodic component of the image pickup device is defined as $P_s$ and the minimum periodic component of the image formed on the image pickup device by the alignment optical system is defined as $P_{min}$, the minimum periodic component of the pseudo-signal is represented as $1/(1/P_s - 1/P_{min})$.

Accordingly, filtering for removing the component having this cycle or less may be satisfactorily performed.

For this, it is satisfactory that an operation represented by the following Equation (13) may be performed using a filter F(k, k') which does not include the periodic component approximately equal to or less than $1/(1/P_s - 1/P_{min})$.

$$(f')_{k'} = \sum_{(K-m<k<K'+m)} f_k F(k, k') \quad (13)$$

Moreover, by obtaining the product of the right side of the above Equation (13) and the window function W(dx), a deficiency wherein the value does not smoothly converge to zero at the end portion of the interpolation filter during noise removal may be resolved.

Furthermore, in the actual processing, values obtained by the operation represented by Equation (13) are obtained beforehand and stored in the storage apparatus in tubular form, and during the interpolation operation, the values may be read from the storage apparatus to perform the process. In such a manner, the operation processing time can be shortened, and further shortening of the processing time can be achieved.

Still further, a description will be made for the case where the low-pass filtering of a two-dimensional signal $f_{kx, ky}$ (kx:0, 1, . . . , nx; ky:0, 1, . . . , ny; nx, ny≧1; at least one of nx and ny is >1; x-directional sampling interval $T_x$; y-directional sampling interval $T_y$) is performed. Now, the signal after the low-pass filtering is given as $f_{kx'ky'}'$.

First, as for each value $f'_{kx'ky'}$, a point ($P_x$, $P_y$) is obtained wherein a position $P_x(kx)$, $P_y(ky)$ on the digital image which corresponds to kx, ky, and a position $P_x'(kx')$, $P_y'(ky')$ corresponding to kx', ky' are coincident or proximate to each other.

Next, with this point ($P_x$, $P_y$) as a center, for signals $f_{kx, ky}$ of one or more close points ($P_x-mx<kx<P_x+nx$, $P_y-my<ky<P_y+ny$), an operation shown by Equation (14) is performed on an arbitrary function S(kx, kx', ky, ky') depending on k and k' and on a function F(x, y) which can be regarded as not including a periodic component approximately smaller than $1/(1/P_s - 1/P_{min})$ in at least one direction by the use of a numerical value row $F_{i, j}$ obtained by sampling in the cycle $T_x$, $T_y$. Thus, low-pass filtering of the two-dimensional signal can be performed.

$$f'_{kx',ky'} = \sum_{\substack{(Px-mx<kx<Px+nx) \\ (Py-my<ky<Py+ny)}} f_{kx,ky} F_{kx-kx',ky-ky'} \quad (14)$$

In addition, a description will be made for the case of performing interpolation together with low-pass filtering.

The signal after converting the foregoing two-dimensional signal $f_{kx,\,ky}$ is defined as $f'_{kx'ky'}$(kx':0, 1, . . . , nx'; ky':0, 1, . . . , ny'). This signal after the conversion has a sampling interval satisfying at least one of $T_x > T_x'$ and $T_y > T_y'$.

In the case of performing interpolation together with low-pass filtering, first, for each value of $f'_{kx'ky'}$, a proximate point $(P_x, P_y)$ is obtained wherein the position $P_x(kx)$, $P_y(ky)$ on the digital image which corresponds to kx, ky, and the position $P_x'(kx')$, $P_y'(ky')$ corresponding to kx', ky' are coincident or proximate to each other.

Next, with this point $(P_x, P_y)$ as a center, an operation represented in Equation (15) is performed using signal of one or more limited close points $f_{kx,\,ky}$ ($P_x$−mx<kx<$P_x$+nx, $P_y$−my<ky<$P_y$+ny) and an arbitrary function S(kx, kx', ky, ky') depending on k and k', and thus low-pass filtering and interpolation of the two-dimensional signal can be performed.

$$f'_{k'} = \sum_{\substack{(Px-mx<kx<Px+nx) \\ (Py-my<ky<Py+ny)}} f_k S(kx, kx', ky, ky') \quad (15)$$

Herein, the function S(kx, kx', ky, ky') is a function s(dx, dy) depending on the variables dx=$P_x$(kx)−$P_x'$(kx') and dy=$P_y$(ky)−$P_y'$(ky'). This function S(dx, dy) is a function capable of being regarded as approximately $1/(1/P_s-1/P_{min})$ in at least any one of the x direction and the y direction.

In addition, the function S(dx, dy) is represented by Equation (16) using $H_x$ and $H_y$ satisfying:

for the case of $P_s\{x\} > 0.5 \times P\{x\}_{max}$, $H_x = 1/(1/P_s(x) - 1/P\{x\}_{max})$;

for the case of $P_s\{y\} > 0.5 \times P\{y\}_{max}$, $H_y = 1/(1/P_s(y) - 1/P\{y\}_{max})$ (where the symbol { } denotes the x or y direction.)

$$S(dx, dy) = s_x(dx) \times s_y(dy) \quad (16)$$

where $$s_x(dx) = \frac{\sin(2\pi dx / 2H_x)}{2\pi dx / 2H_x}$$

$$s_y(dy) = \frac{\sin(2\pi dy / 2H_y)}{2\pi dy / 2H_y}$$

Moreover, as for the foregoing function S(dx, dy), one obtained by further multiplying S(dx, dy), represented by Equation (16), by the window function W(dx, dy) may also be used.

Furthermore, in the actual processing, a method may be also adopted such that values of the operation in Equation (16) are obtained beforehand and stored in the storage apparatus in tabular form, and during the interpolation operation, values corresponding to the value of dx and dy are read from the storage apparatus and processed. With such a method, the operation processing time can be shortened and further shortening of the time can be achieved.

It is recommended that the filter $F_{kx-kx',\,ky-ky'}$ be made as a limited length filter F(dkx, dky) depending, respectively, on kx−kx' and ky−ky'. There are various types of filters, but obtained by multiplying a sinc function by an appropriate window function W(dx) is used, for example.

When the minimum periodic component of a false signal is represented as $P_c = 1/(1/P_s - 1/P_{min})$, the filter F(dx) is represented by Equation (17).

$$F(dx) = \frac{\sin(2\pi dx / P_c)}{2\pi dx / P_c} \quad (17)$$

Other than the above, for a Savitzky-Golay filter, for example, as the filter size thereof is made larger, the minimum periodic component is relatively increased. Therefore, a similar effect can be obtained by the use of a filter having an appropriate size.

In the above description, elimination of aliasing for a one-dimensional image signal was described. However, similar to the case of interpolation, such elimination can also be achieved for a two-dimensional image signal using the product of the filter functions obtained in their respective directions.

Moreover, low-pass filtering and interpolation can be performed simultaneously. The method of performing noise removal simultaneously with interpolation was described previously. However, if the condition is satisfied wherein the interpolation filter does not approximately include a periodic component equal to or less than $1/(1/P_s-1/P_{min})$, even for the case where the minimum division unit of the image pickup device is 0.5 times or more of the minimum periodic component of the image, a measurement with good accuracy is possible.

The interpolation operation has been described as above. Hereinbelow, a description will be made for the use of interpolation in the position measurement.

Edge detection and a correlation method are well-known as mark delection method.

In edge detection, an edge is predetermined by calculating a differential image signal of an input image, a slice level is fixed for the edge by a predetermined method, and the position where the edge crosses the slice level is interpolated therein; thus a measurement is performed with accuracy equal to or less than the sampling interval of the digital image data or less.

An example of the correlation method is a normalized mutual correlation method, in which a template image signal is prepared beforehand, a normalized mutual correlation between the template image signal and an input image signal is calculated while shifting the relative position of the template image signal and the input image signal, and a correlation function depending on this relative position is computed; thus a peak position of the correlation function is obtained.

Moreover, there is a self-correlation method used for the case where there is symmetry in the input image.

In the self-correlation method, a signal is divided into two parts at a position considered to be a close point to a symmetrical point, the position coordinate of one part of the divided signal is inverted, and a correlation is calculated.

This calculation is performed while shifting a center point which devides the signal into two in order to compute a correlation function. By obtaining a peak of the correlation function, the position of the symmetrical point of the image can be measured. In performing the position measurement by these methods, as a method of performing the interpolation, there is an interpolation method of using the position measurement similar to that of a pre-process, such as filtering.

Specifically, the method consists of performing the measurement after filtering or interpolation is performed. For this case, the template image signal at the sampling intervals after the interpolation must be used in the normalized mutual correlation method and the like.

Moreover, there is also a method of using interpolation in an intermediate state of the measurement. Although both a differential signal and an original signal thereof are used in edge detection, since the differential signal is made for the purpose of "recognizing" an edge position, there are many cases where the interpolation is not required.

In this case, when a signal obtained by differentiating the input image signal and a signal subjected to interpolation and smoothing are used, there is a merit in the processing rate.

Furthermore, in the correlation method, the correlation function becomes a function of the relative position between the input image signals or between the input image signal and the template image signal, which are signals typically sampled at the sampling intervals of the image data.

Accordingly, the interpolation is performed for this correlation function, and an improvement in the accuracy in the peak detection can also be achieved.

Hereinbelow, a description of the simulation results of sampling measurement errors for the case of using the prior art and this embodiment will be given.

Figure 4:
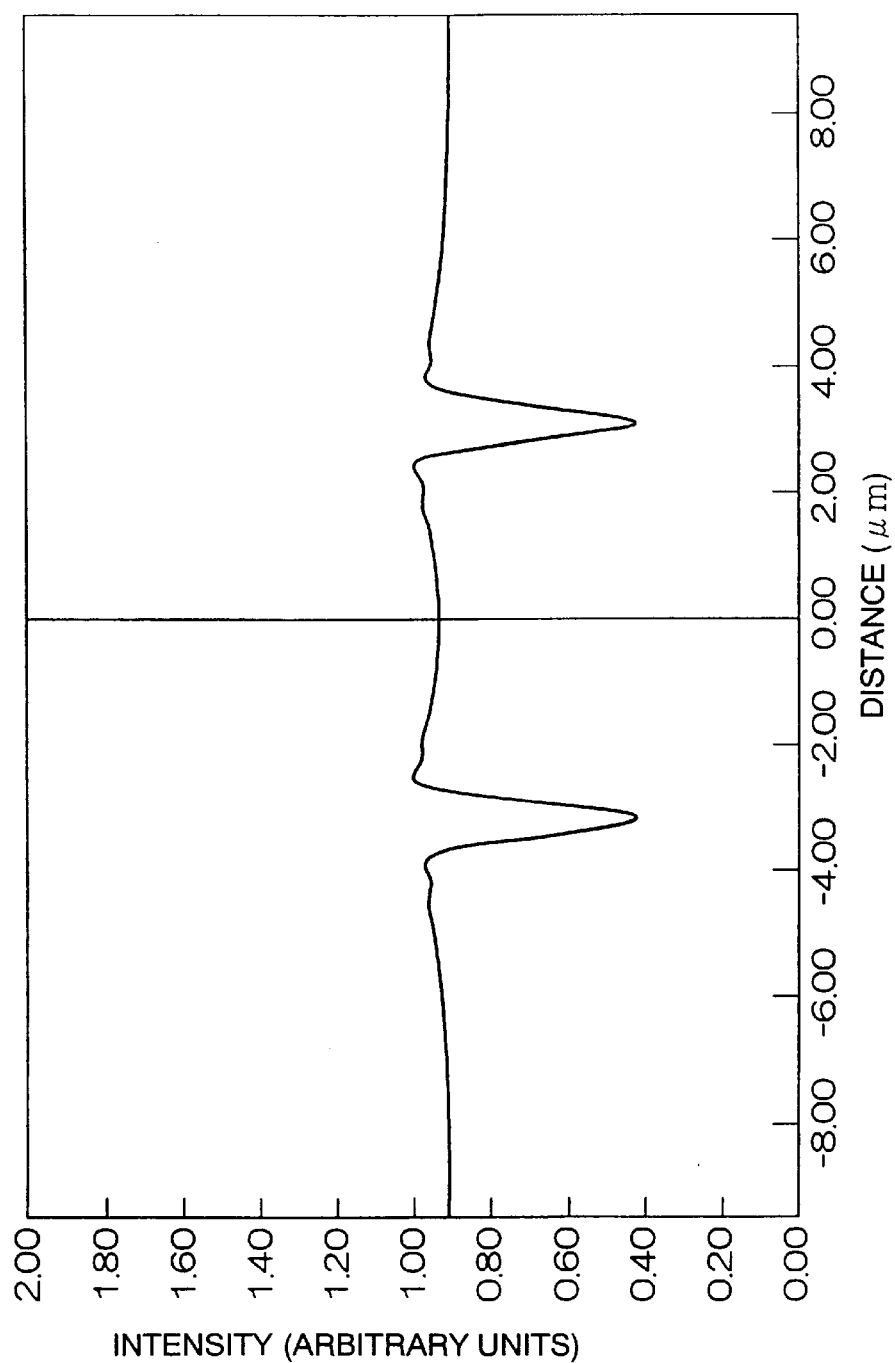
FIG. 4 is a one-dimensional projection of a step difference mark image formed on an image pickup device by an optical system for conditions where NA is 0.6, the wavelength is 0.6 $\mu$m, and the illumination sigma is 1.0.

FIG. 4 is a one-dimensional projection of a step difference mark image formed on an image pickup device by an optical system for conditions where NA is 0.6, the wavelength is 0.6 μm, and the illumination sigma is 1.0. This projection is obtained by a simulation.

When the minimum periodic component included in the image is calculated in consideration of the magnification or the like of the optical system and then converted with respect to wafer 12, the minimum periodic component is 0.6/(2× 0.6)=0.5 μm.

Figure 5:
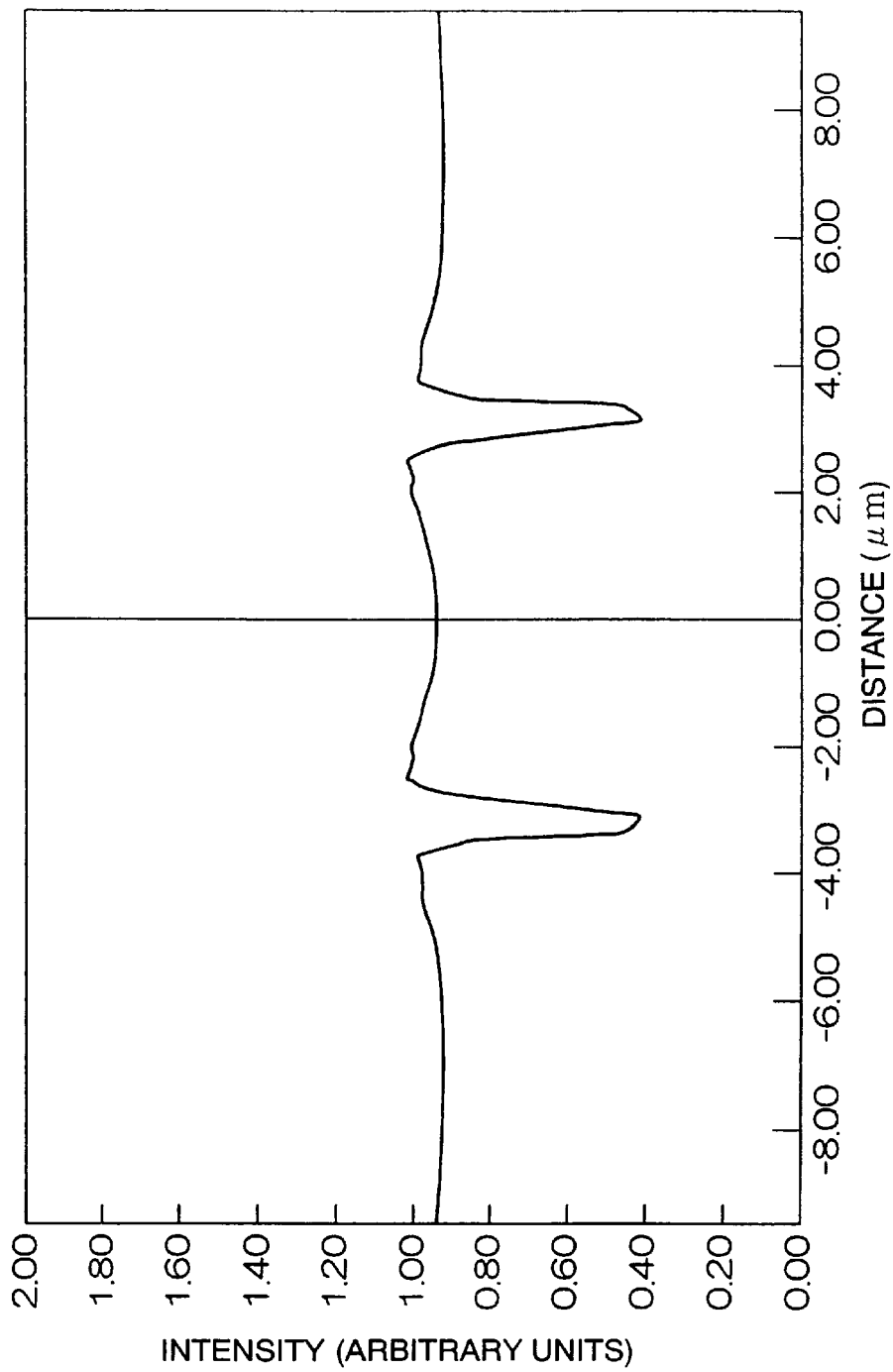
FIG. 5 is a signal obtained by sampling the image shown in FIG. 4 with a sampling interval of 0.24 $\mu$m.
Figure 6:
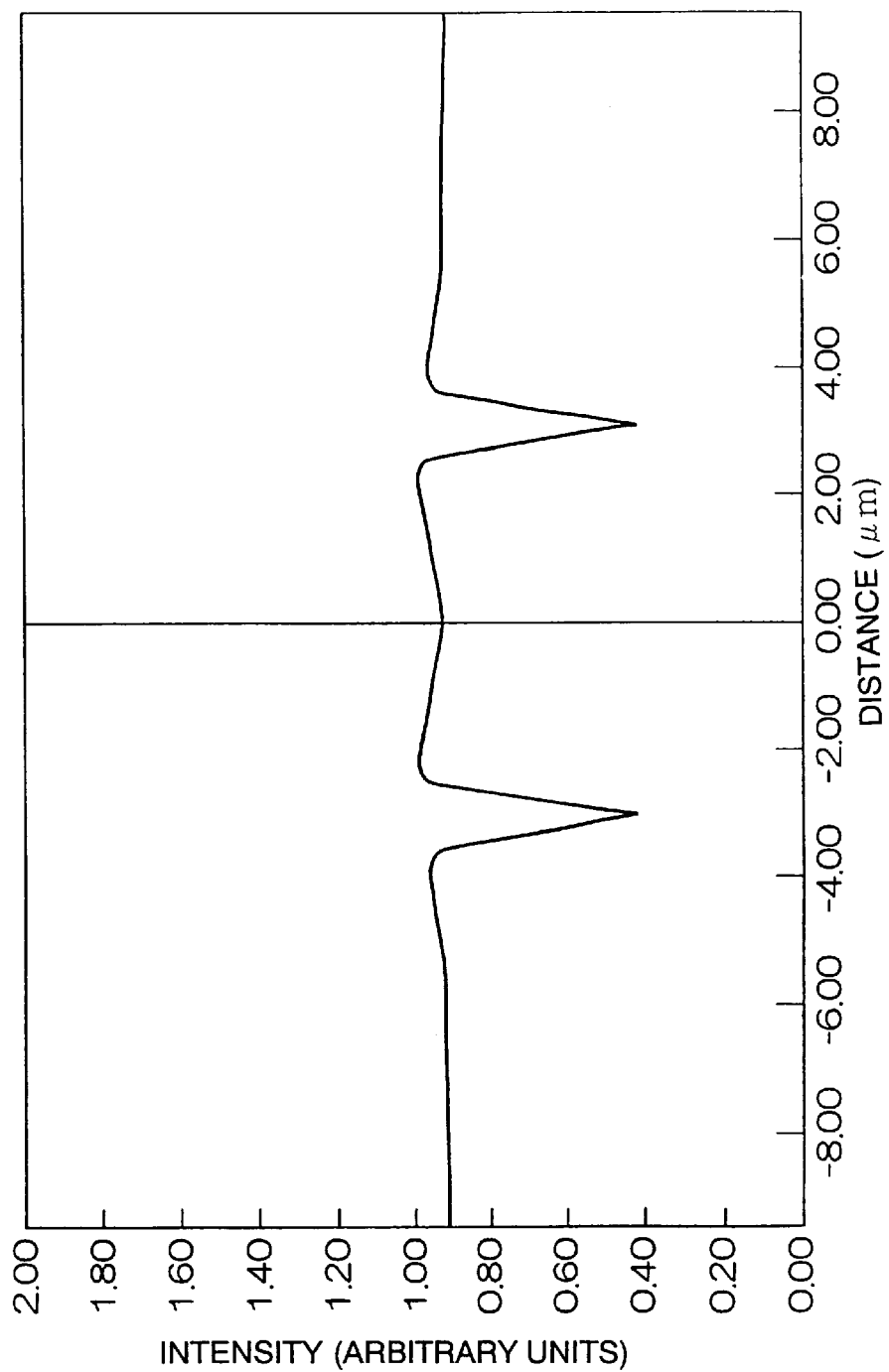
FIG. 6 is a signal obtained by sampling the image shown in FIG. 4 with a sampling interval of 0.24 $\mu$m.

FIGS. 5 and 6 are signals obtained by sampling the image shown in FIG. 4 in a sampling interval of 0.24 μm. The mark detection method according to one embodiment of the present invention was not used for obtaining these results.

The difference between FIGS. 5 and 6 is the difference in the sampling phases in the simulation results. Specifically, in the actual apparatus, the simulation results correspond to measurement results for the case of moving the position of the image pickup device such as a CCD camera.

When FIGS. 5 and 6 are compared with each other, the shapes of the signals are apparently different from each other, and thus it is anticipated that an error will occur when edge detection, the correlation measurement and the like are performed.

When the measurement position is changed due to the phase relationship between the position of the image and the position of the image pickup device, the change in the measurement position causes an error in the sampling.

Figure 7:
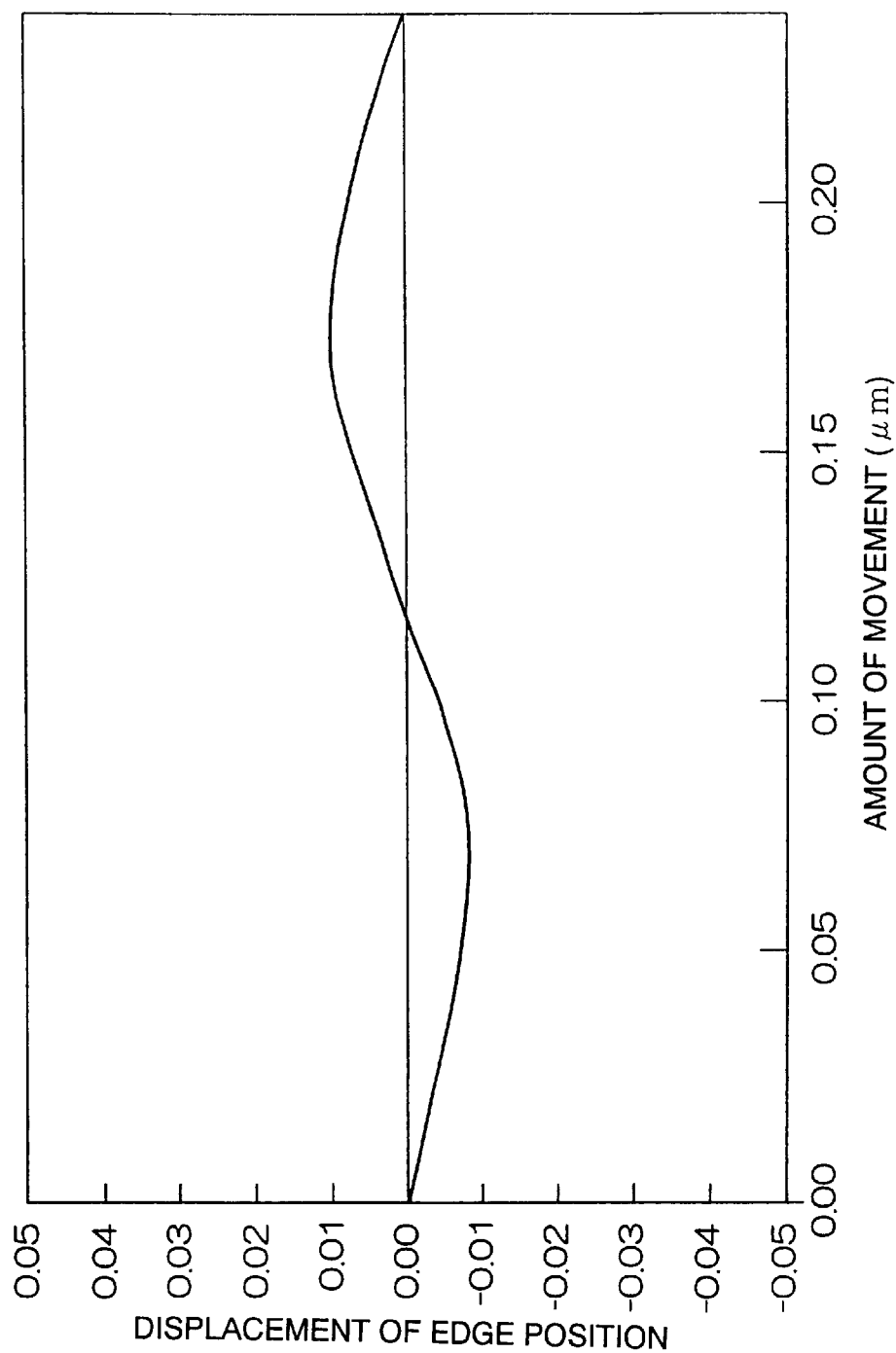
FIG. 7 is a diagram showing the dislocation amount of an edge position when an image position for an image pickup device is moved.

Therefore, in order to assess this error, after sampling is performed for image data in a cycle of 0.24 μm while moving the same by a sampling interval of 100 μm, edge detection is performed to investigate the difference between the moving amount and the measurement value, and then the shape in FIG. 7 appears. FIG. 7 is a diagram showing the dislocation amount of the edge position for the case where the position of the image for the image pickup device is moved.

Figure 15:
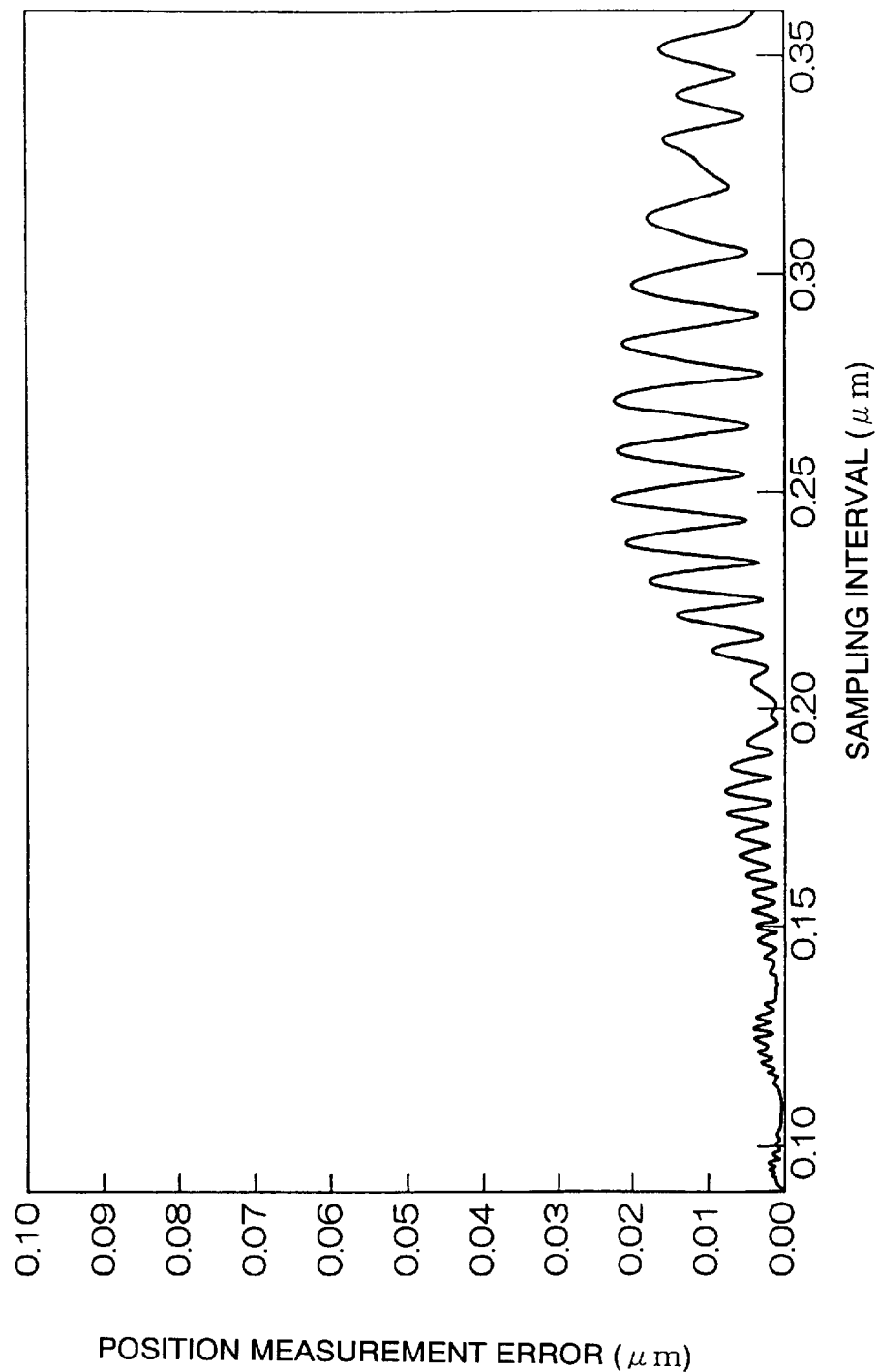
FIG. 15 is a diagram showing position measurement error when a step difference mark of a 6 $\mu$m line is sampled for different sampling intervals.

FIG. 15 shows a variation in the dislocation amount between the moving amount and the measurement value while changing the sampling interval. With reference to FIG. 15, although the variation amount behaves cyclically, it can be seen that the error increases after the sampling interval exceeds 0.2 μm. This is a condition where the sampling interval is about 0.4 times the minimum periodic component of the image.

Incidentally, in the mark detection method according to one embodiment of the present invention, interpolation is performed during the measurement.

Figure 8:
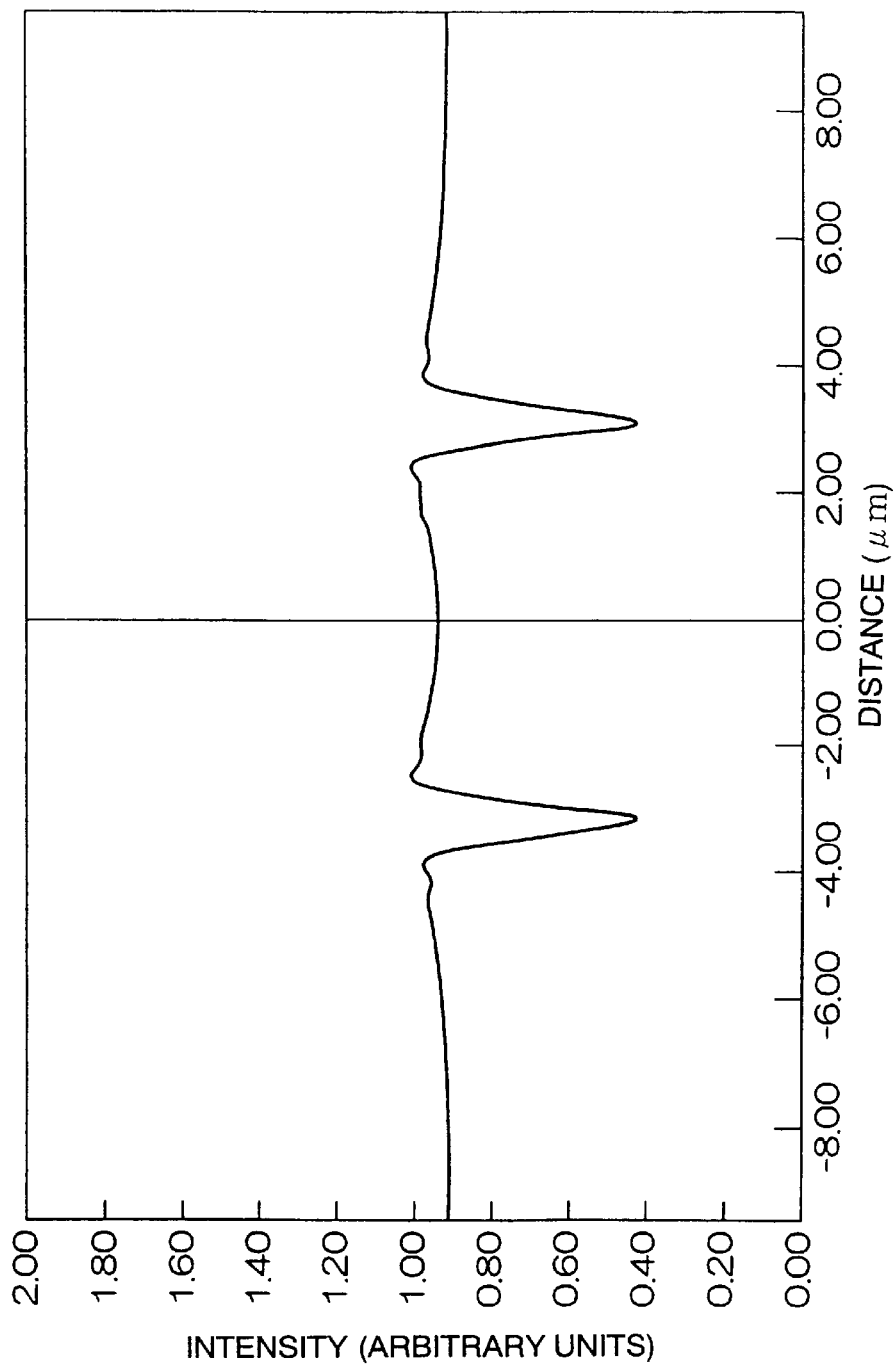
FIG. 8 is a diagram showing the simulation results obtained by performing a three-point interpolation on the respective sampled points for the signal shown in FIG. 5.
Figure 9:
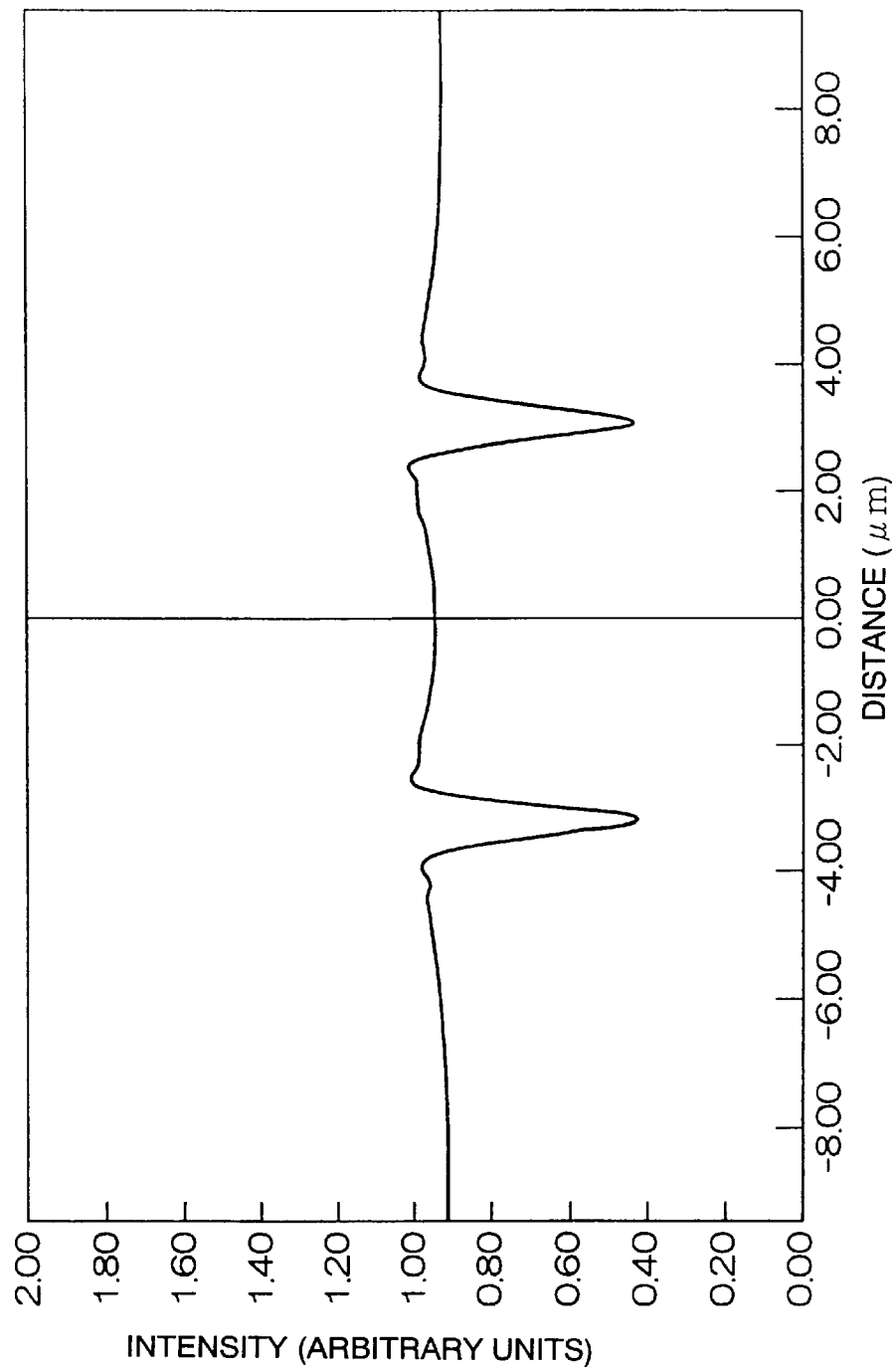
FIG. 9 is a diagram showing the simulation results obtained by performing a three-point interpolation on the respective sampled points for the signal shown in FIG. 6.

FIGS. 8 and 9 are diagrams showing simulation results obtained by performing a three-point interpolation on the respective sampled points sampled from the signals shown in FIGS. 5 and 6.

Figure 10:
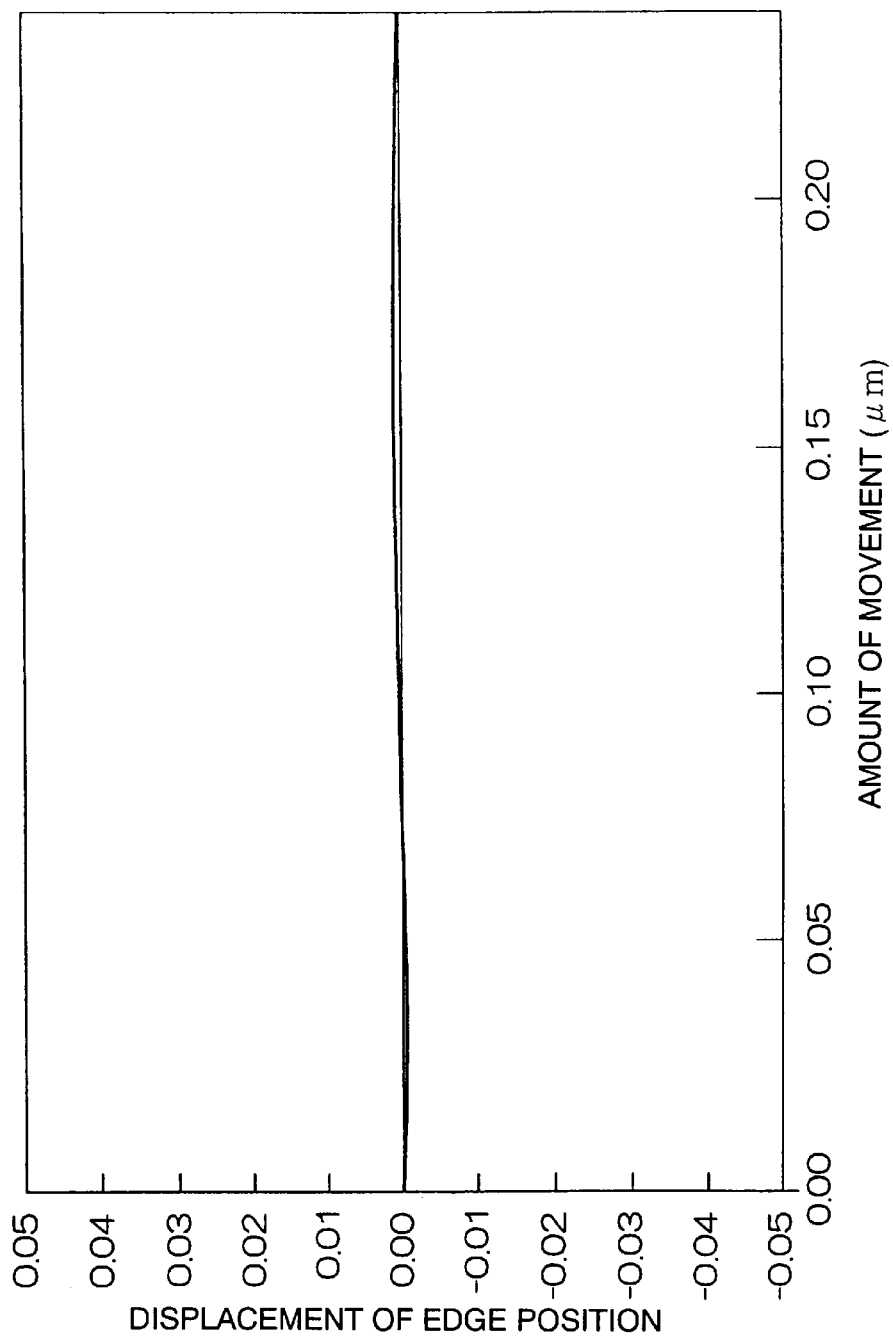
FIG. 10 is a diagram showing the dislocation amount of an edge position when an image position for an image pickup device subjected to interpolation is moved.

In addition, FIG. 10 is a diagram showing the dislocation amount of the edge position for the case where the position of the image for the image pickup device subjected to the interpolation is moved.

With reference to FIG. 10, there is hardly any dislocation amount of the edge position with respect to the amount of movement, and it can be seen recognized that the accuracy is significantly improved by performing the interpolation.

FIG. 15 is a diagram showing simulation results of the position measurement error for the case where the sampling interval is changed without performing the pre-processing as described above.

Figure 11:
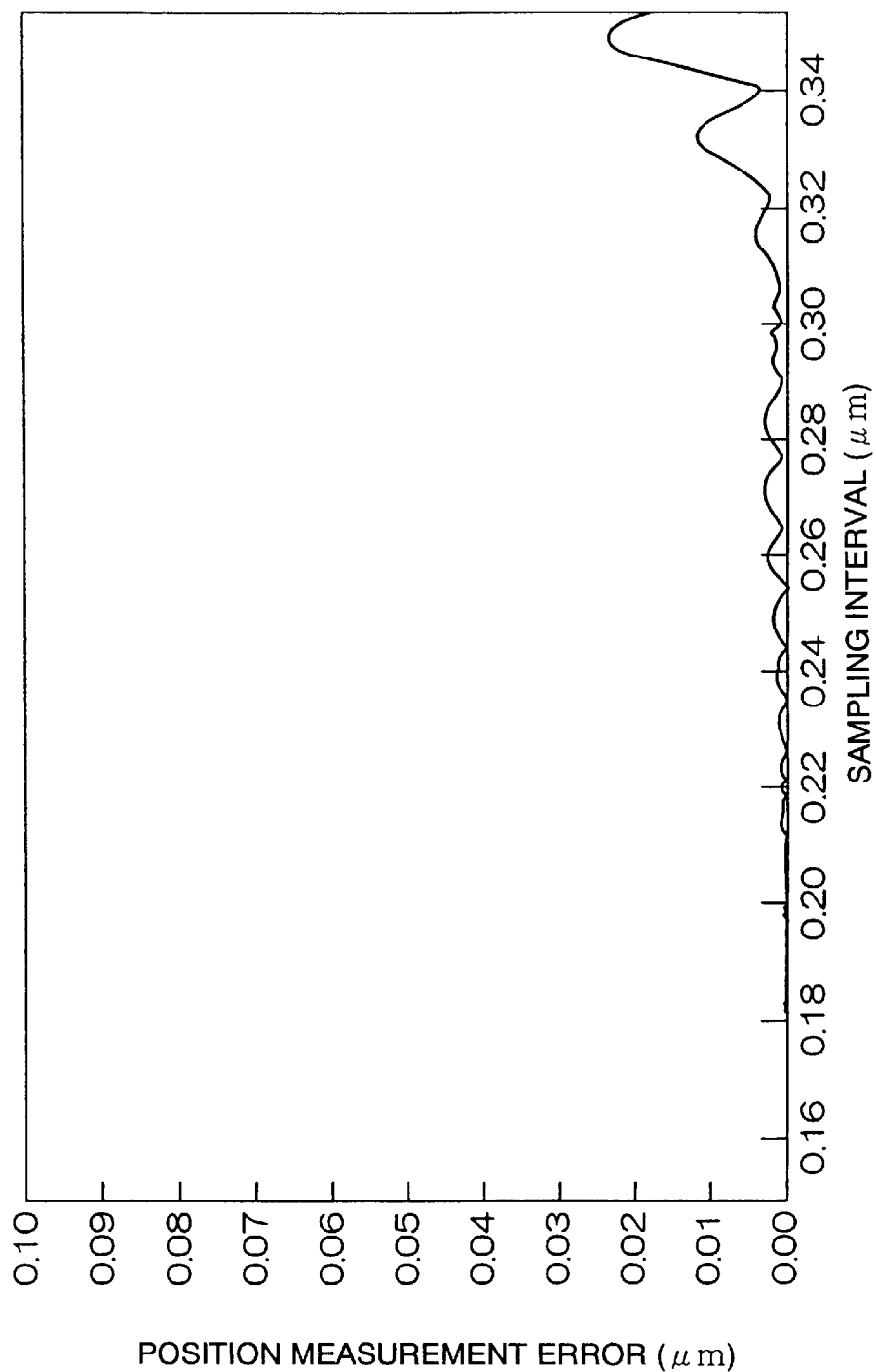
FIG. 11 is a diagram showing the simulation results of position measurement error when a sampling interval is changed when performing only interpolation.

In addition, FIG. 11 is a diagram showing simulation results of the position measurement error for the case where the sampling interval is changed when performing only interpolation.

Figure 12:
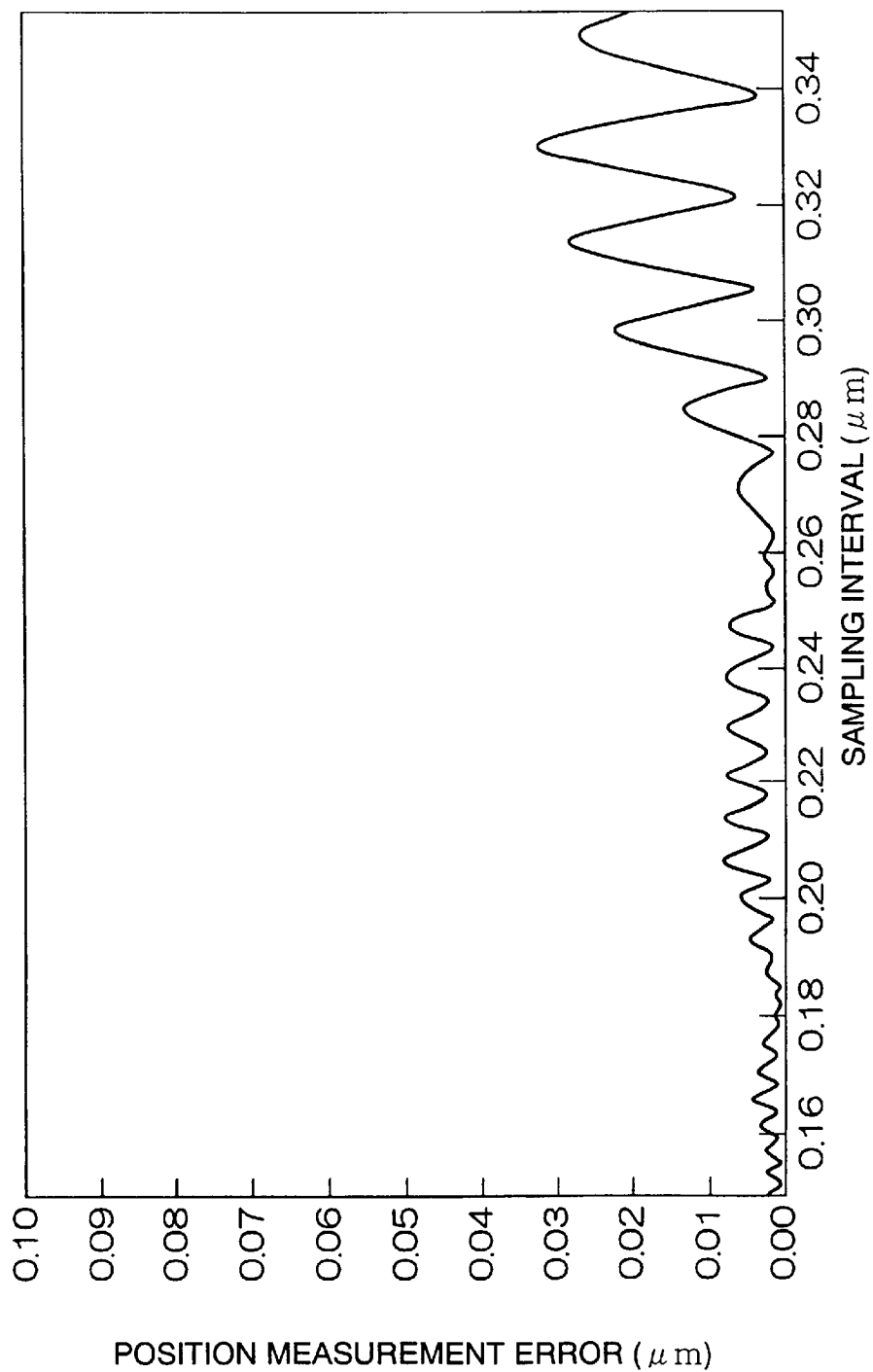
FIG. 12 is a diagram showing the simulation results of position measurement error when the sampling interval is changed when performing only low-pass filtering.

FIG. 12 is a diagram showing simulation results of the position measurement error for the case where the sampling interval is changed when performing only low-pass filtering.

Figure 13:
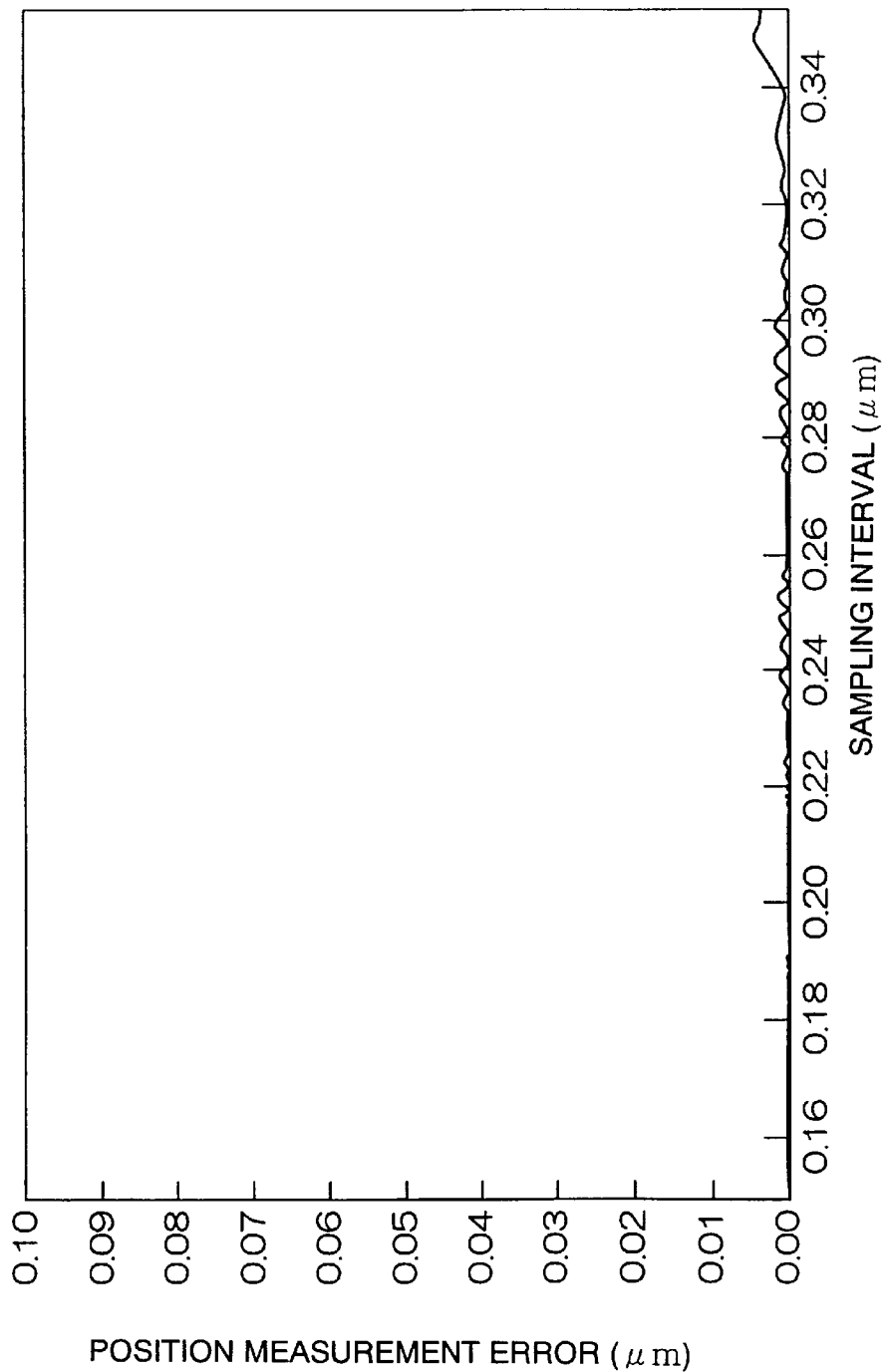
FIG. 13 is a diagram showing the simulation results of position measurement error when the sampling interval is changed when performing interpolation and low-pass filtering.
Figure 14:
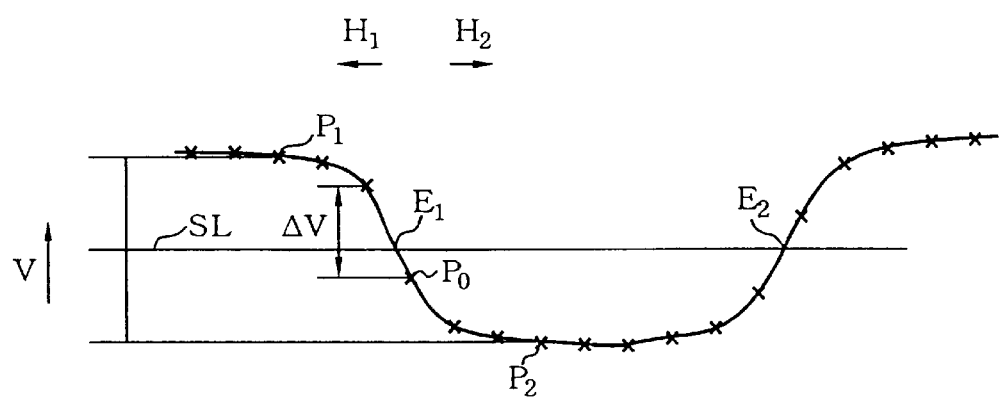
FIG. 14 is a diagram for explaining the process of edge detection.

FIG. 13 is a diagram showing simulation results of the position measurement error for the case where the sampling interval is changed when performing interpolation and low-pass filtering.

With reference to FIG. 11, it can be seen that by performing the three-point interpolation, the measurement accuracy is good until the sampling interval is 0.6 times the minimum periodic component of the image, that is, until the sampling interval is 0.3 μm.

Under this condition, although aliasing occurs to diminish theoretically the measurement accuracy, the amplitude of the minimum periodic component included in the image is not relatively large and contributes little to the measurement; thus the measurement accuracy is not diminished very much. When the sampling interval exceeds 0.6 times the minimum periodic component of the image, the accuracy diminishes as shown in the drawing.

In FIGS. 12 and 13, filtering for removing a periodic component equal to 1 μm or less is performed. Counting backwards from $P_f=1/(1/P_s-1/P_{min})$, if $P_s<0.33$ μm, the aliasing component which causes a problem will be removed ensuring good accuracy.

In the case of performing only low-pass filtering (see FIG. 12), the accuracy is improved slightly in comparison with the case of performing no pre-processing (see FIG. 15); however, errors by sampling other than aliasing are large, thus it cannot be said that there is a very good effect. It is recognized that the errors are shifted to a longer sampling interval as a whole.

On the other hand, in the case of performing low-pass filtering and interpolation together (see FIG. 11), the accuracy is improved in comparison with the case of only performing interpolation (see FIG. 12). With reference to FIG. 13, simulation results with extremely good accuracy can be obtained up until the sampling interval $P_s$ reaches $P_s=0.33$ μm.

From the above simulations, it is recognized that the mark detection method according to this embodiment is extremely effective for the case where the sampling interval cannot be set to be 0.5 times or less of the minimum periodic component of the image.

Figure 16:
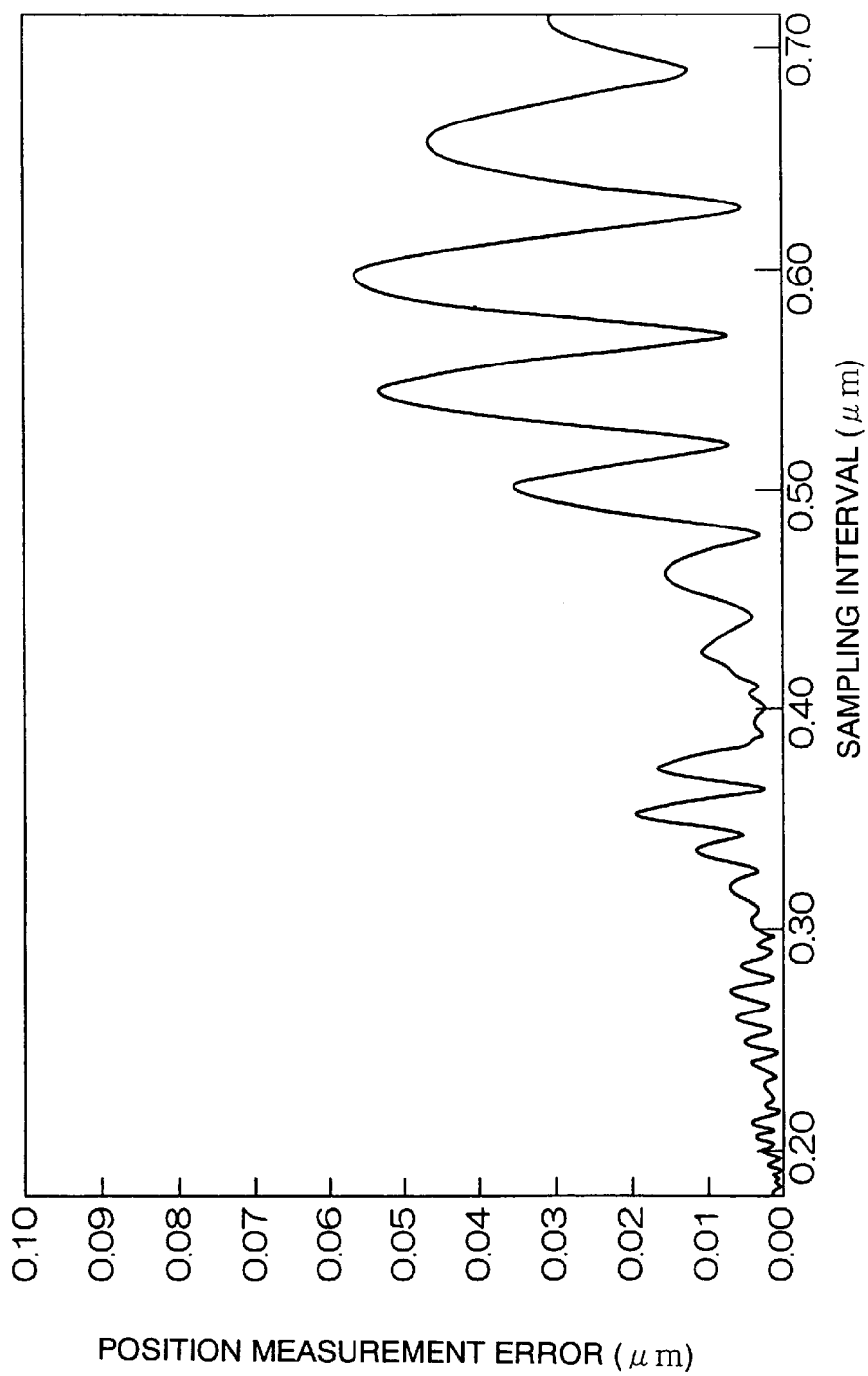
FIG. 16 is another diagram showing the position measurement error when a step difference mark of a 6 μm line is sampled for different sampling intervals.
Figure 17:
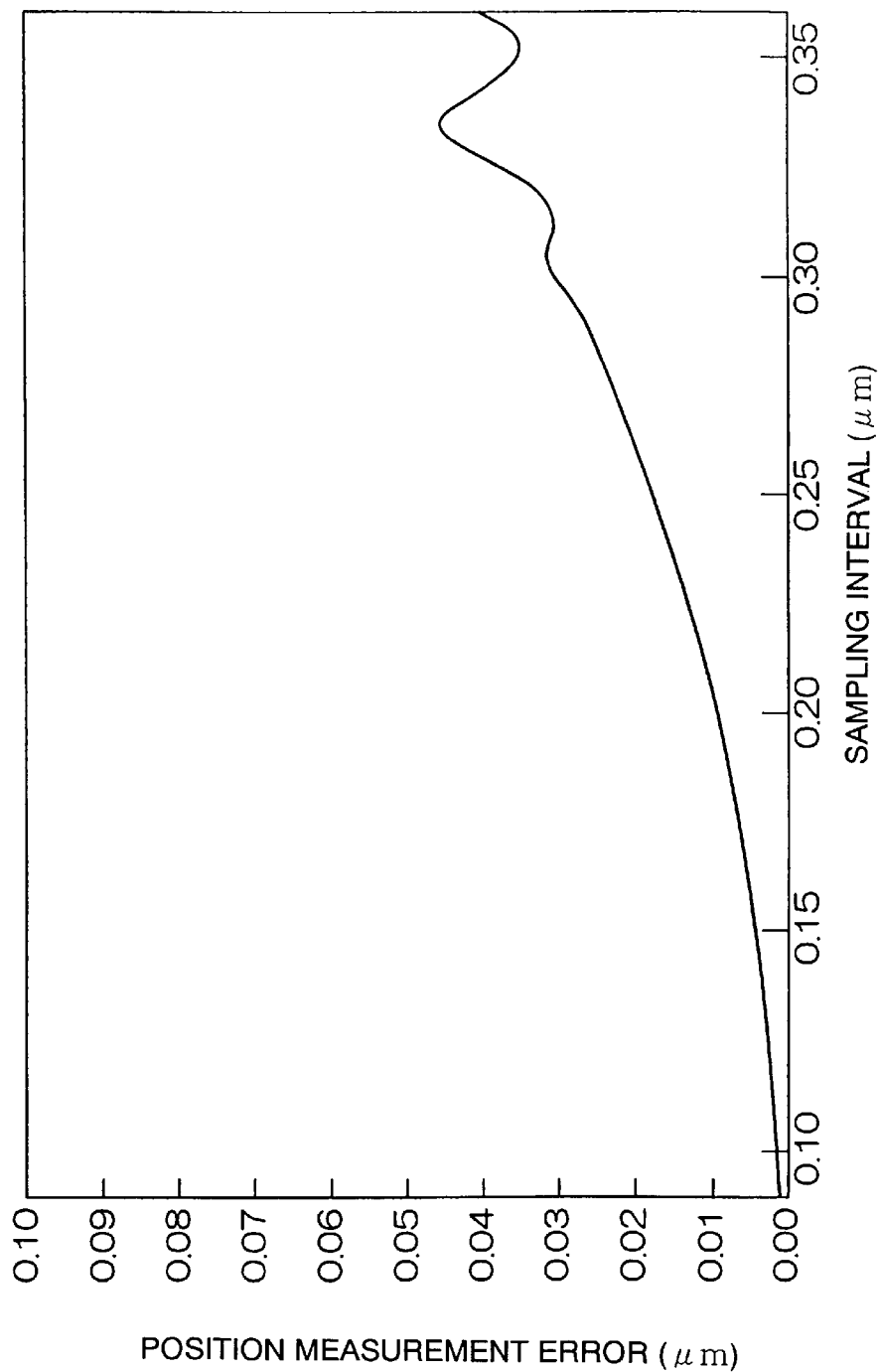
FIG. 17 is a diagram showing the simulation results representing the relationship between the sampling interval and position measurement error when normalized mutual correlation is used.
Figure 18:
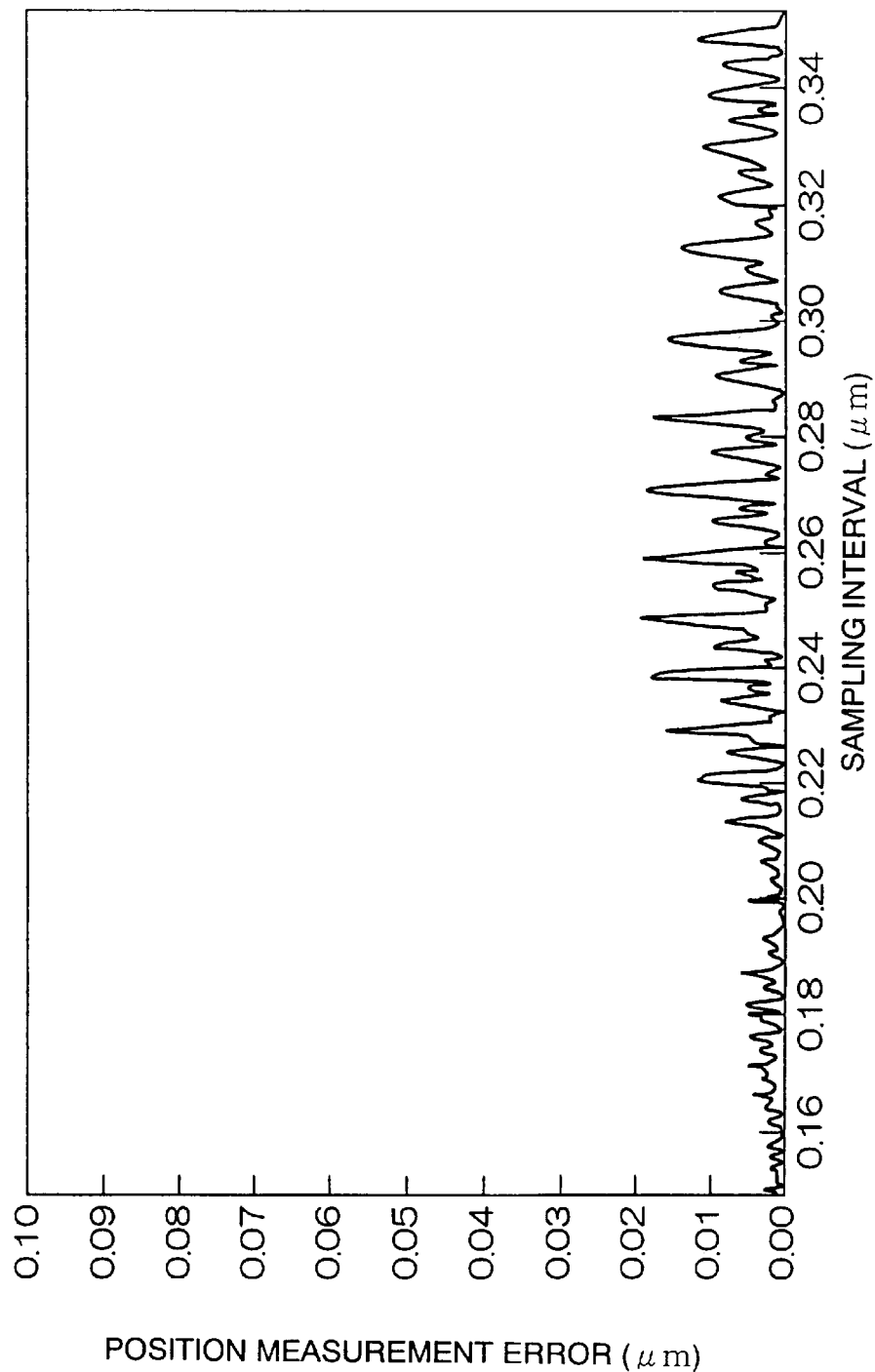
FIG. 18 is a diagram showing the simulation results representing the relationship between the sampling interval and position measurement error when the number of alignment marks is three.
Figure 19:
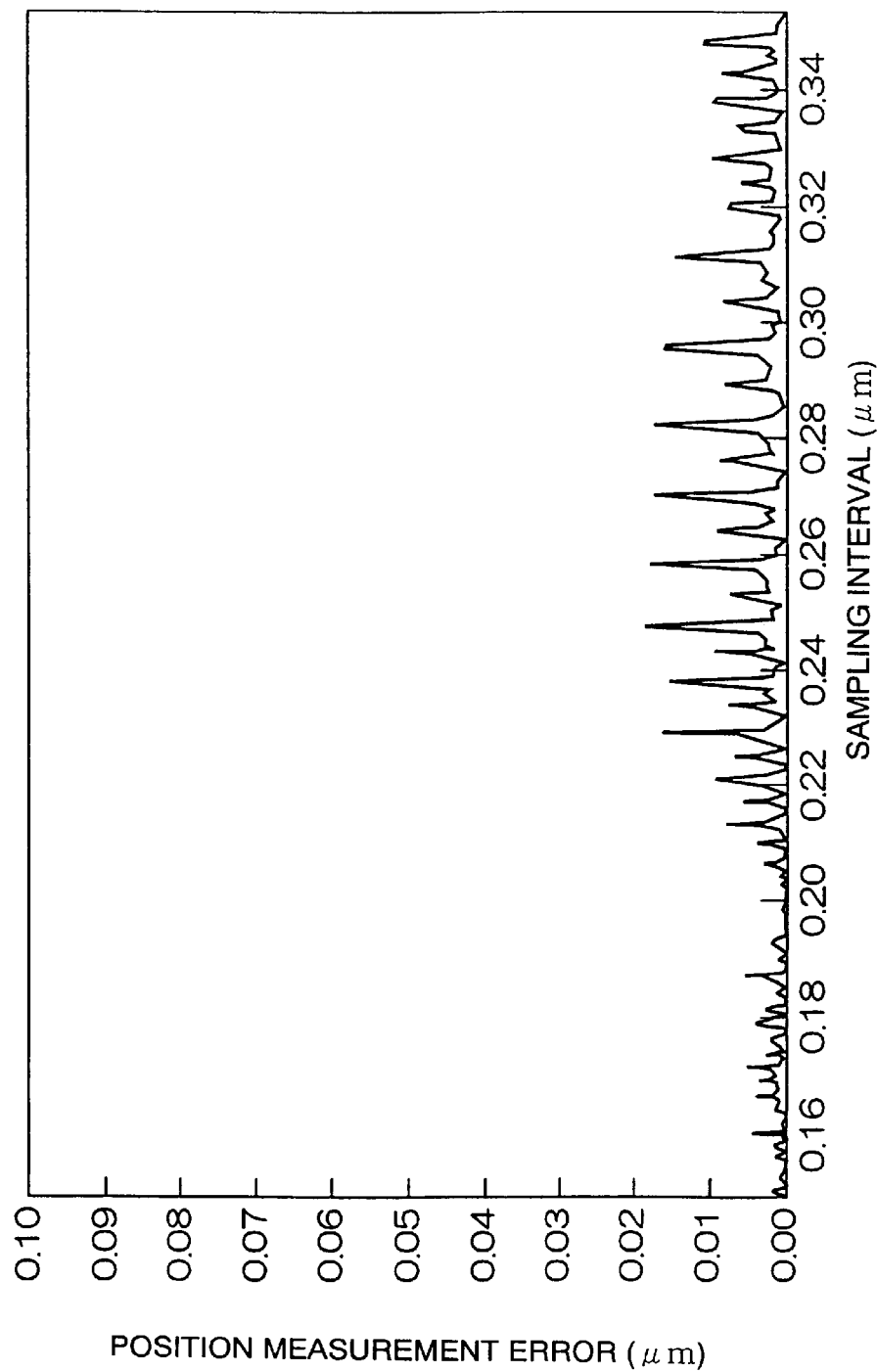
FIG. 19 is a diagram showing the simulation results representing the relationship between the sampling interval and position measurement error when the number of alignment marks is six.
Figure 20:
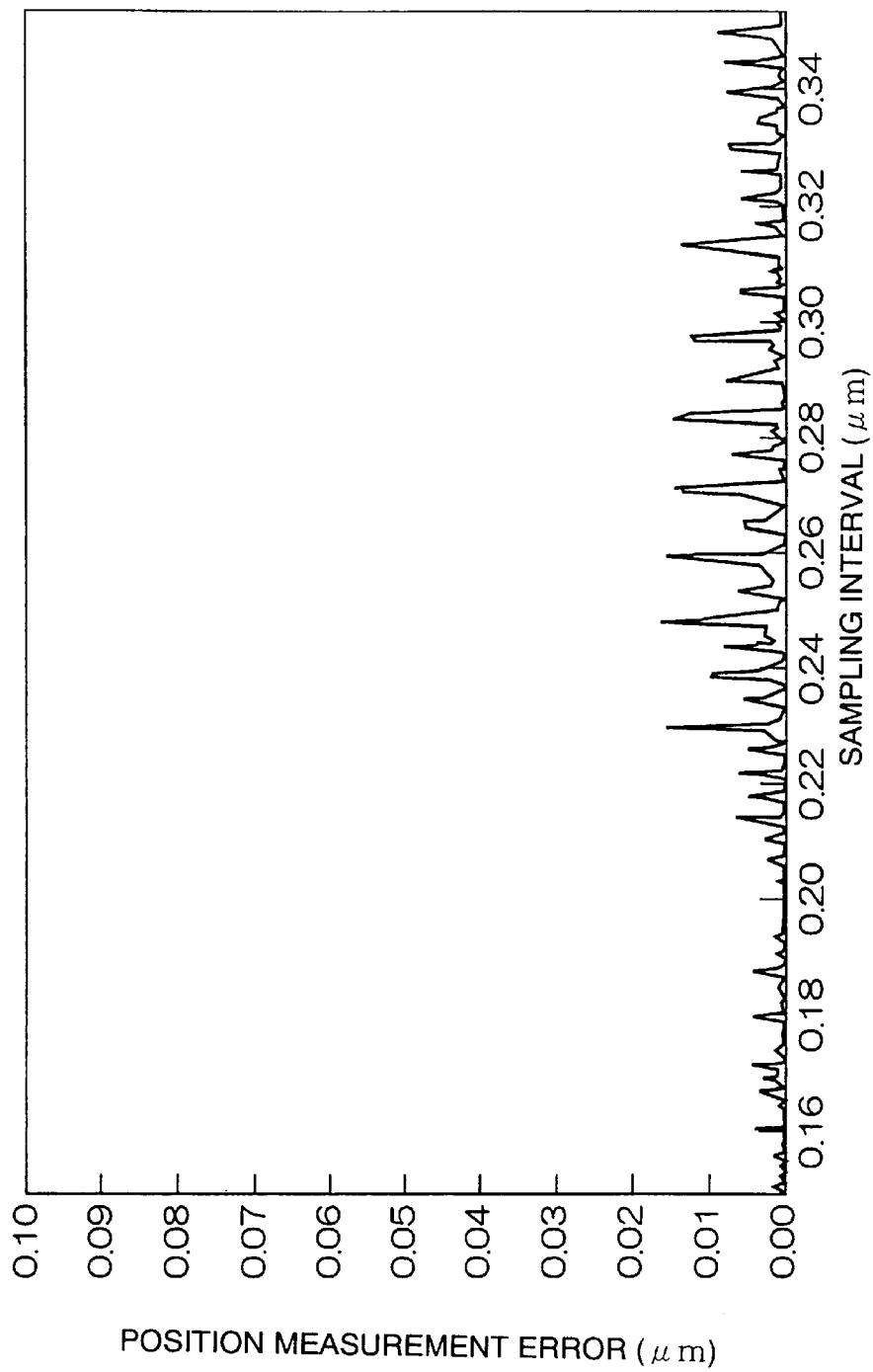
FIG. 20 is a diagram showing the simulation results representing the relationship between the sampling interval and position measurement error when the number of alignment marks is nine.

Herein, once more, a description will be made of the simulation results shown in FIG. 15 (numerical aperture NA=0.6, $P_{min}=0.5$ μm) and FIG. 16 (numerical aperture NA=0.3, $P_{min}=1$ μm). As described above, the accuracy is deminished for any NA in the region of $0.2 \times P_{min} < P_s < 0.39 \times P_{min}$ and in the region of $P_s > 0.41 \times P_{min}$. (The position measurement error becomes larger than the allowable error of about 3 to 5 nm.)

However, the accuracy is improved in the region $0.39 \times P_{min} < P_s < 0.41 \times P_{min}$.

On the basis of the simulation results described above, if the pixel size $P_s$ of the image pickup device is determined so as to satisfy the condition of $0.39 \times P_{min} < P_s < 0.41 \times P_{min}$, the measurement error of the mark position (edge position) can be controlled within an allowable value (5 nm in FIG. 15), thus the measurement accuracy can be improved. In other words, for the case where the pixel size $P_s$ cannot be changed (in the case of a fixed pixel size), the magnification of the optical system (image-forming optical system for observing a mark in order to form an image thereof on the image pickup device) is determined so as to satisfy the condition of $0.39 \times P_{min} < P_s < 0.41 \times P_{min}$, thus the measurement accuracy of the mark can be improved.

Moreover, on the basis of the foregoing simulation results, if the condition that the line width of a mark=$(2n+1) \times P_s/2$ is satisfied between the shape (pitch) of an observed mark (mark having a cycle) and the pixel size $P_s$, that is, if the sampling position and the edge position are shifted from each other, the position measurement error can be controlled to within the allowable error (the accuracy can be improved). Accordingly, also by using a mark satisfying the condition that the line width of a mark=$(2n+1) \times P_s/2$, the mark measurement accuracy can be improved. In other words, when the magnification of the image-forming optical system is determined so as to satisfy the condition that the line width of a mark=$(2n+1) \times P_s/2$, the mark measurement accuracy can be improved. Note that this method is effective for both the condition $P_s > 0.2 \ P_{min}$, where interpolation is required, and the condition $P_s > 0.5 \ P_{min}$, where aliasing is generated.

Furthermore, by forming the line width of the mark unevenly in the mark, the sampling position and the edge position of the mark can be shifted from each other. When such a mark is used for the measurement, the mark measurement position can be improved. In addition, when such an uneven mark (a mark constituted of a plurality of lines and spaces and having different line widths and space widths in the visual field (within the mark)) is used, the measurement error can be reduced in all the pixel sizes by an averaging effect. Note that this method is also effective for both the condition "$P_s > 0.2 \ P_{min}$, where interpolation is required, and the condition $P_s > 0.5 \ P_{min}$, where aliasing is generated.

Incidentally, the interpolation method in the above-described embodiment is a method of obtaining intensities (for example, luminance) of positions among the sample points ($f_3$ to $f_6$ in FIG. 2) by linear combination of the intensities (for example, luminance) of the sample points.

More specifically, the interpolation method is a method of obtaining an arbitrary point (interpolation point $f'_8$) by performing a weighting operation by the use of a proximate point (above-described $f_5$ in FIG. 2) of an arbitrary point to be subjected to interpolation (for example, previously described $f'_8$ in the description of FIG. 2) and several sample points in front of and behind the proximate point (above-described $f_4$ and $f_6$ in FIG. 2).

The coefficients corresponding to the respective sample points (close sample points $f_4$ to $f_6$ in FIG. 2) used in this linear combination (weighting operation) are equivalent to the contribution from the respective sample points, that is, the weighting (weighting coefficients). Note that negative values are also included in this weighting.

Incidentally, according to the sampling theorem, in order to restore continuous data to its pre-sampled state, the condition in that the sum total of the weights for weighting is always constant must be satisfied. When an infinite number of sample points are used (when the sum of an infinite number of coefficients is taken), the sum total of the weights can be made constant, and thus the foregoing condition can be satisfied.

However, in the actual interpolation processing, the weighting operation is performed in a limited region (with limited sample points). When the interpolation is performed in a limited region, the sum total of the weights is not constant and cyclical noise occurs at the sampling intervals, causing the reduction of an S/N ratio for a signal having a low contrast. In order to solve this problem, standardizing processing must be performed on the above-described interpolation filter (weighting function, sinc function).

Hereinbelow, a description will be made for the standardizing processing for the interpolation filter.

A description will be made for the case of standardizing the interpolation filter $S(dx)$ in the foregoing Equation (3), which is given by the product of the interpolation filter $S$ having a limited length in the foregoing Equation (2) and the previously-described window function $W(dx)$.

First, before a value of a certain arbitrary point (the point to be interpolated) is calculated by the use of the interpolation filter $S(dx)$ in Equation (3), the sum (sum total) obtained by the interpolation filter $S(dx)$ is calculated.

Next, the coefficient values of the respective sample points (coefficients of the respective sample points obtained by the interpolation filter) used for this operation are divided by the obtained sum total. Thus, in all the cases (in all the arbitrary interpolation points), the sum total of the weighting can be set to "1" (a constant value). For this reason, the noise described above is not generated. Then, this result obtained by the division is used as a weight coefficient of the sample point.

Herein, a description will be specifically made for this standardizing processing by exemplifying the case where the interpolation is performed for the arbitrary interpolation point $f'_8$ described with reference to FIG. 2 by the use of the sample points $f_4$, $f_5$ and $f_6$ in the vicinity of interpolation point $f'_8$. The weight coefficients of the respective sample points $f_4$, $f_5$ and $f_6$, which are obtained by the interpolation filter $S(dx)$ are defined as $a_4$, $a_5$ and $a_6$. The sum total $\Sigma a$ of $a_4$ to $a_6$ is obtained. And, by dividing the respective coefficients $a_4$ to $a_6$ by the sum total $\Sigma a$, $a_4/\Sigma a$, $a_5/\Sigma a$ and $a_6/\Sigma a$ are determined as the weight coefficients of the respective sample points $f_4$, $f_5$ and $f_6$.

Next, a description will be made for another aspect of the interpolation filter.

Performing differentiation after performing interpolation or performing interpolation after performing differentiation leads to an increase in the processing time. Therefore, a description will be made for an aspect where differentiation and interpolation are simultaneously performed simultaneously in order to achieve a shortening of the processing time.

Performing the differentiation calculus after performing filtering by a sinc function S(dx) is equivalent to performing filtering by a function f(x) represented by the following Equation (18) when the sampling interval is defined as T.

$$f(x) = \frac{2f_1 \cos(2\pi x/2T)}{x} - \frac{\sin(2\pi x/2T)}{\pi x^2} \quad (18)$$

where f(x)=0

In order to restore data by performing interpolation using this filter f(x), the condition that the sum total of the contributions (sum total of the weight coefficients) for calculating a certain arbitrary interpolation point is always zero (hereinafter, referred to as a "summation condition") must be satisfied, and the condition that a moment $\Sigma f(x) \cdot x$ is always constant (hereinafter, referred to as a "moment condition") must also be satisfied. However, as described previously, since the weighting operation is performed in a limited region (with limited sample points), these two conditions cannot be satisfied naturally. For this reason, when the interpolation is performed by the use of this filter f(x) without satisfying the conditions, cyclical noise occurs at the sampling intervals, causing a reduction in an SIN ratio for a signal having a low contrast. Accordingly, in the case of performing filtering using this function f(x), the standardizing processing must also be performed.

First, the sum (sum total) $\Sigma f(x)$ of the coefficients in the respective sample points obtained by the filter f(x) is calculated.

Next, the obtained sum total $\Sigma f(x)$ is divided by the number n of the sample points utilized for the linear combination (weighting operation), and $\Sigma f(x)/n$ obtained by the division is subtracted from the values of the coefficients of the respective sample points (coefficients of the respective sample points obtained by the filter f(x)). The function f(x) representing the respective coefficients is converted as described above to be a function f'(x), that is, $f'(x)=f(x)-\Sigma f(x)/n$.

Next, by the use of the conversion function f'(x), the sum total $\Sigma f'(x) \cdot x$ of the moments $f'(x) \cdot x$ of the coefficients in the respective sample points is obtained, and the respective coefficients by the conversion function f'(x) obtained previously are divided by this sum total of the moments. And, the result $f'(x)/(\Sigma f'(x) \cdot x)$ obtained by the division is used as a weight coefficient of the sample point.

In the foregoing manner, standardization of the filter function f(x) is possible, that is, the above-described summation condition and moment condition can be satisfied.

Herein, a description will be specifically made for this standardizing processing by exemplifying the case where the interpolation is performed on the arbitrary interpolation point $f_8$ described with reference to FIG. 2 using the sample points $f_4$, $f_5$ and $f_6$ in the vicinity of the point $f_8$. Weight coefficients of the respective sample points $f_4$, $f_5$ and $f_6$, which are obtained by the interpolation filter f(x), are defined as $b_4$, $b_5$ and $b_6$. The sum total $\Sigma b$ of these $b_4$ to $b_6$ is obtained. And, $b_4-\Sigma b/n$, $b_5-\Sigma b/n$ and $b_6-\Sigma b/n$, which are obtained by subtracting $\Sigma b/n$, obtained by dividing the sum total $\Sigma b$ by the number of the sample points (in this case, three) from the respective coefficients $b_4$ to $b_6$, are obtained. These $b_4-\Sigma b/n$, $b_5-\Sigma b/n$, and $b_6-\Sigma b/n$ are respectively defined as $b_4'$, $b_5'$, and $b_6'$.

Next, the moments of the coefficients in the respective sample points are obtained. When the distances of the function f'(x) from the origin in the sample points $f_4$, $f_5$ and $f_6$ are respectively defined as $c_4$, $c_5$ and $c_6$, the moments of the respective coefficients $b_4$ to $b_6$ become $c_4 \cdot_4'$, $c_5 \cdot b_5'$ and $"c_6 \cdot b_6'$. Next, the sum total $\Sigma x \cdot f'(x)$ of the respective moments is obtained (specifically, $\Sigma x \cdot f'(x) = c_4 \cdot b_4' + c_5 \cdot b_5' + c_6 \cdot b_6'$ is established).

Then, $b_4'/\Sigma x \cdot f'(x)$, $b_5'/\Sigma x \cdot f'(x)$ and $b_6'/\Sigma x \cdot f'(x)$, which are obtained by dividing $b_4'$ to $b_6'$ obtained previously by the sum total $\Sigma x \cdot f'(x)$ of the moments, are determined to be the weight coefficients of the respective sample points $f_4$, $f_5$ and $f_6$.

Note that although the alignment of the wafer has been exemplified in the mark detection method and, the exposure method according to the above-described embodiment of the present invention, the present invention is not limited to the above-described embodiment.

For example, in the position measurement using an image sensor having a limited minimum division unit such as a CCD or a line sensor, the present invention can be applied to position measurement for other objects such as a mask on a reference plate.

The method of interpolating for a discretized signal and the method of using a filter for removing aliasing is not limited to the case of detecting a position from an optical image.

Specifically, for example, like the above-described LSA-type alignment sensor, in the case of performing position detection by taking a signal related to the alignment mark while moving (scanning) a wafer stage relative to an alignment light, a light intensity signal for a discretized position is similarly obtained. When detecting the position from this signal, the sampling interval of the signal must be sufficiently smaller than the minimum periodic component of the signal. The sampling interval is determined by the clock frequency of the electrical system and the moving rate (scanning rate) of the wafer stage. By using a large sampling interval to perform the interpolation, the scanning rate can be accelerated without reducing the accuracy. Therefore, not only can throughput be improved, but also the clock frequency of the electrical system can be decreased to improve the S/N ratio.

In the case where the contrast of the image is measured at some points with respect to the direction of the optical axis of the projection optical system, and a focal point position measurement signal depending on the focal point of the projection optical system is obtained, the best focus position of the projection optical system is obtained, and a focal point position measurement signal regarding the discretized focal point is similarly obtained. Also, in this case, the number of measurement points can be reduced by using the interpolation of the present invention for the focal point position measurement signal without lowering the measurement accuracy; thus the measurement rate can be improved to a great extent.

Note that the exposure apparatus (FIG. 1) according to this embodiment is manufactured so as to be able to control the position of wafer 12 with good accuracy at a fast rate, and to enable exposure with high exposure accuracy while improving throughput. Specifically, the exposure apparatus according to this embodiment is manufactured in such a manner that the respective elements shown in FIG. 1, such as the above-described illumination systems 1 to 9, reticle alignment system 31, wafer alignment system 32 and projection optical system 11 are coupled and fabricated to one another electrically, mechanically, or optically, and then an overall adjustment (electrical adjustment, operation confirmation, or the like) is performed thereto. Note that the manufacturing of the exposure apparatus is desirably performed in a clean room where the temperature, degree of cleanness, and the like are controlled.

Next, a description will be made for the manufacturing of a device using the exposure apparatus and method of this embodiment.

Figure 21:
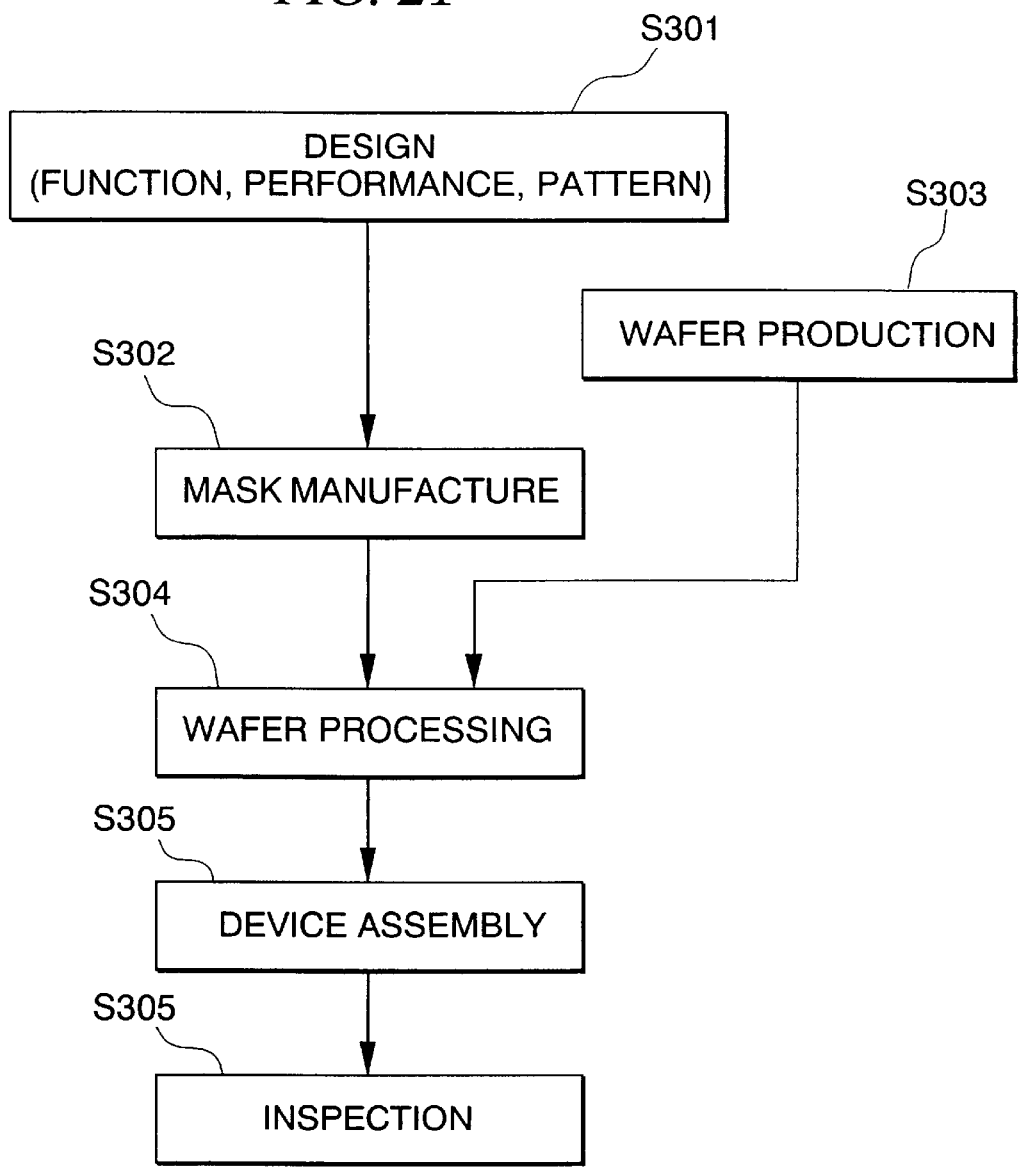
FIG. 21 is a flowchart for the production of a device (a semiconductor chip such as an IC or LSI, a liquid crystal panel, a CCD, a thin-film magnetic head, a micro-machine or the like) in the embodiment of the present invention.

FIG. 21 is a flowchart for producing a device in this embodiment (a semiconductor chip such as an IC and an LSI, a liquid crystal panel, a CCD, a thin-film magnetic head, a micro-machine and the like). As shown in FIG. 21, first, in step S301 (designing step), the function of the device is designed (for example, design for a circuit of the semiconductor device), and pattern design for realizing the function is performed. Subsequently, in step S302 (mask manufacturing step), a mask having the designed circuit pattern formed thereon is manufactured. Meanwhile, in step S303 (wafer producing step), a wafer is produced by the use of a material such as silicon.

Next, in step S304 (wafer processing step), an actual circuit or the like is formed on the wafer by a lithography technique as described later using the mask and the wafer which are prepared in steps S301 to S303. Then, in step S305 (fabricating step), a chip is made using of the wafer processed in step S304. In this step S305, processes such as an assembly process (dicing, bonding) and a packaging process (chip sealing) are included.

Finally, in step S306 (inspection step), inspections, such as an operation confirmation test and a durability test, are performed for the device fabricated in step S305. The device is completed after going through such steps, and then shipped.

Figure 22:
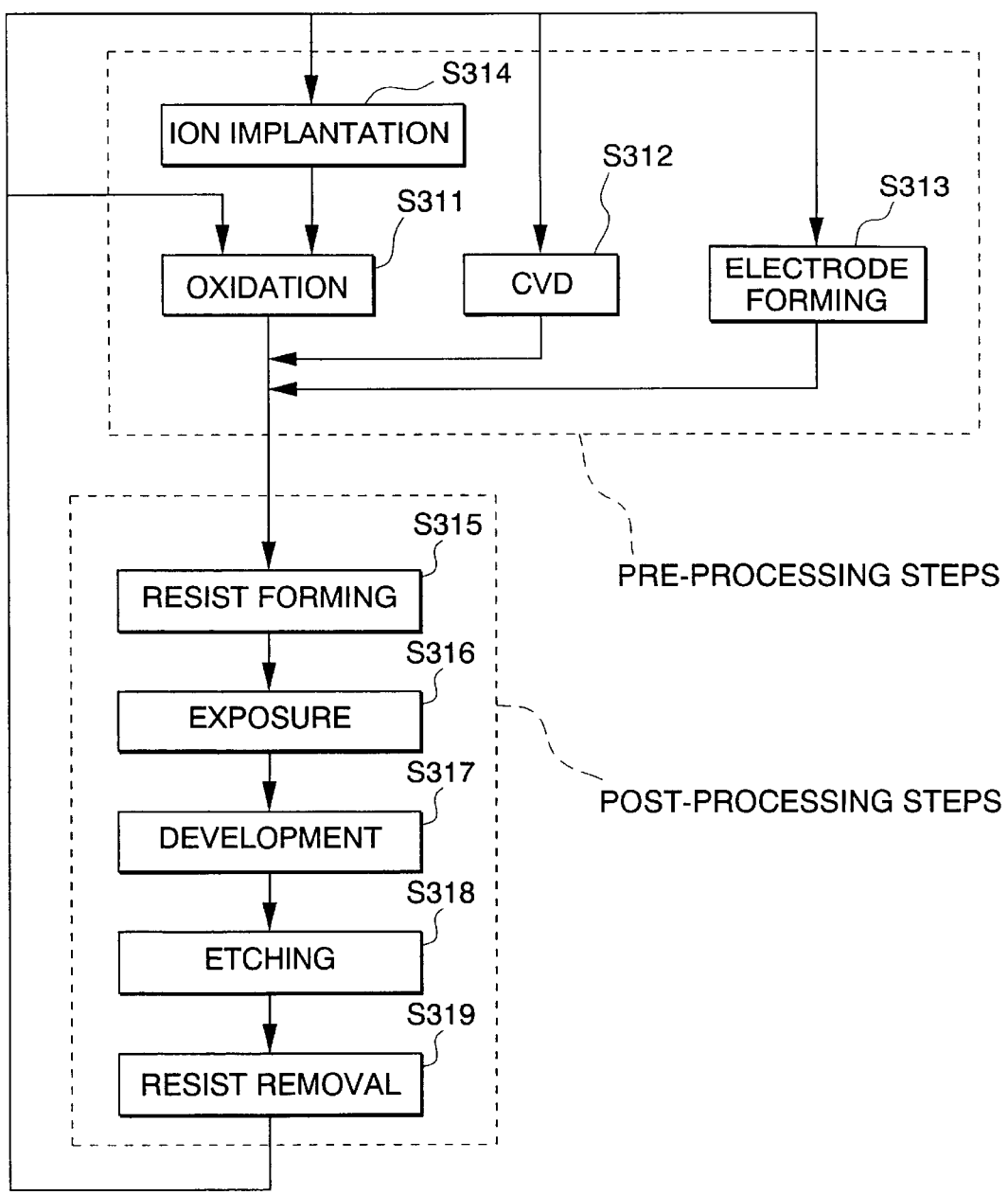
FIG. 22 is a flowchart showing the details of step S304 of FIG. 21 for the case of a semiconductor device.

FIG. 22 is a flowchart showing the detailed flow of the foregoing step S304 for the case of manufacturing a semiconductor device. In FIG. 22, the surface of the wafer is oxidized in step S311 (oxidation step). In step S312 (CVD step), an insulating film is formed on the wafer surface. In step S313 (electrode forming step), an electrode is formed on the wafer by deposition. In step S314 (ion implanting step), ions are implanted in the wafer. Each of the above steps S311 to S314 constitutes a pre-step for each stage of the wafer processing, and is selected and executed according to the necessary processing in each stage.

In each stage of the wafer processing, after the pre-steps are completed, a post-step is executed as follows. In this post-step, first, photosensitive agent is coated on the wafer in step S315 (resist forming step). Then, in step S316 (exposure step), the circuit pattern of the mask is printed and exposed on the wafer by the above-described exposure apparatus. Next, in step S317 (development step), the exposed wafer is developed. Subsequently, in step S318 (etching step), exposed members of a portion other than the portion where the resist remains are removed by etching. Then, in step S319 (resist removal step), the unnecessary resist remaining after the etching has been completed is removed.

By performing these pre-steps and post-steps repeatedly, a plurality of circuit patterns are formed on the wafer.

In the above-described manner, a device having a fine pattern formed thereon is manufactured with high accuracy in mass production.

Note that the exposure apparatus of this embodiment can be applied to an exposure apparatus of a scanning type (U.S. Pat. No. 5,473,410), which moves a mask and a substrate synchronously to expose a pattern of a mask. Moreover, the exposure apparatus of this embodiment can be applied to an exposure apparatus of a step-and-repeat type, which exposes a pattern of a mask in a state where the mask and substrate are made static, and then moves the substrate sequentially by steps. Furthermore, the exposure apparatus of this embodiment can be applied to a proximity exposure apparatus which allows a mask and a substrate to closely contact each other without using a projection optical system, and then exposes a pattern of the mask.

In addition, the application of the exposure apparatus is not limited to an exposure apparatus for manufacturing a semiconductor. For example, the exposure apparatus can be extensively applied to an exposure apparatus for liquid crystal which exposes a pattern of a liquid crystal display device on a square-shaped glass plate, an exposure apparatus for manufacturing a thin-film magnetic head, and the like.

Not only a g-ray (436 nm), an i-ray (365 nm), a KrF excimer laser (248 nm), an ArF excimer laser (193 nm) and an $F_2$ laser (157 nm), but also a charged particle ray such as an X-ray and an electron ray can be used as the light source of the exposure apparatus of this embodiment. For example, in the case of using an electron ray, an electron gun, or lanthanum hexaboride ($LaB_6$) and tantalum (Ta) of the thermal electron radiation type can be used.

The magnification of the projection optical system is not only a reduction system but may also be either an equal magnification system or a magnification system.

In the projection optical system, when using a far-ultraviolet ray such as an excimer laser, a material which transmits a far-ultraviolet ray therethrough such as quartz and fluorite is used as the glass material. In the case of using an $F_2$ laser or an X-ray, the projection optical system is a catadioptric or dioptric system (a reflection type reticle is also used). In addition, in the case of using an electron ray, an electron optical system that consists of an electron lens and a polariscope may be satisfactorily used as the optic system. The optical path for transmitting an electron ray therethrough is in a vacuum state.

When using a linear motor for the wafer stage or the reticle stage (see U.S. Pat. No. 5,623,853 or U.S. Pat. No. 5,528,1118), either an air-floating type utilizing an air-bearing or a magnetic-floating type utilizing a Lorentz force or a reactance force may be used. Moreover, the stage may be either a type which moves along a guide or a guideless type which is not provided with a guide.

Regarding the apparatus for driving a stage, a plane motor for driving a stage by an electromagnetic force may also be used, in which a magnet unit having magnets disposed in two dimensions, and an armature unit having coils disposed in two dimensions, are opposite each other. In this case, it is satisfactory that any one of the magnetic unit and the armature unit may be connected to the stage, and that the other unit may be provided on a moving plane of the stage.

As disclosed in the gazette of Japanese Unexamined Patent Application, First Publication No. Hei 8-166475 (U.S. Pat. No. 5,528,118), a reaction force generated by moving the wafer stage may be sent to the floor (the earth) mechanically by the use of a frame member.

As disclosed in Japanese Unexamined Patent Application, First publication No. Hei 8-330224 (U.S. Ser. No. 08/416,558), a reaction force generated by moving the reticle stage may be sent to the floor (the earth) mechanically by the use of a frame member.

In addition, in the above-described embodiment, a description has been made for the case where a sinc function is used when performing the interpolation. However, the interpolation may be done by fitting using, for example, a spline function. In the case of performing the interpolation on an input image signal itself, the interpolation may be performed on a correlation function prepared on the basis of the concerned image signal.

What is claimed is:

1. A mark detection method comprising:

irradiating a mark formed on an object with a detection beam;

forming an image of said mark through an image-forming system;

converting the image of said mark formed on an image pickup element into an electrical image signal in order to output a signal related to said electrical image signal at predetermined sampling intervals;

performing a smoothing operation to remove a component having a cycle being equal to or less than a predetermined cycle from said signal output at said sampling intervals; and performing interpolation on said signal related to said electrical image signal in a cycle equal to or less than said predetermined sampling interval, wherein said image pickup element has a predetermined pixel size said predetermined sampling interval includes a cycle of said predetermined pixel size, said interpolation is performed in a cycle equal to or less than said predetermined pixel size, said pixel size $P_s$ is a predetermined multiple of a minimum periodic component $P_{min}$ of an image formed on said image pickup element, and said smoothing operation removes a periodic component equal to or less than $1/(1/P_s - 1/P_{min})$, on the basis of said predetermined pixel size $P_s$ and said minimum periodic component $P_{min}$.

2. A mark detection method according to claim 1, wherein said predetermined pixel size $P_s$ is larger than 0.5 times of said minimum periodic component $P_{min}$.

3. A mark detection method according to claim 2, wherein said smoothing operation comprises:

a step of setting a smoothing point where smoothing is performed for said image signal;

a step of selecting, from said image signal, said image signal sampled in a predetermined range that includes said smoothing point;

a step of performing a sampling in a cycle identical to the sampling interval of said image signal, with respect to a function which removes a periodic component smaller than said $1/(1/P_s - 1/P_{min})$, according to a distance between a position of said smoothing point and a position of said selected image signal, a step of calculating a product of said selected image signal and said sampled function with respect to each of said image signals included in said predetermined range, and adding them to each of said image signals.

4. A mark detection method according to claim 2, wherein said smoothing operation comprises:

a step of setting an interpolation point where interpolation for said image signal is performed;

a step of obtaining a most proximate position of said image signal, which is most proximate to a position of said interpolation point;

a step of selecting, from said image signal, said image signal sampled in a predetermined range including said most proximate position; and a step of calculating a product of said selected image signal and a function for removing a periodic component smaller than said $1/(1/P_s - 1/P_{min})$ according to a distance to a position of said selected image signal with respect to each of said image signals included in said predetermined range, and adding said product to said each of said image signals.

5. A mark detection method according to claim 1, wherein said image signal is output as a sample point in said predetermined sampling interval, and interpolation is performed for an arbitrary point in a cycle equal to or less than said predetermined sampling interval by an interpolation method using a conversion including a linear combination of a plurality of said sample points located in the vicinity of the arbitrary point.

6. A mark detection method according to claim 5, wherein said interpolation method includes a weighting operation by the use of said plurality of said sample points.

7. A mark detection method according to claim 5, wherein measurement is performed for a position of said object on the basis of said interpolated image signal.

8. A mark detection method according to claim 5, wherein said predetermined sampling interval is determined on the basis of an amount of position measurement error amount in said measurement.

9. A mark detection method according to claim 8, wherein said object is a substrate onto which a circuit pattern is transferred, and said amount of position measurement error in said predetermined sampling interval has a value of one-fourth a minimum line width of said circuit pattern on which the total overlay is transferred onto said substrate.

10. A mark detection method according to claim 1, wherein said interpolation is performed on said image signal itself.

11. A mark detection method comprising:

imaging a mark formed on an object;

converting an image of said mark, which is formed on an image pickup element, into an electrical image signal;

outputting a signal related to said image signal as a sample point at predetermined sampling intervals;

performing interpolation on an arbitrary point in a cycle equal to or less than said predetermined sampling interval by an interpolation method using a conversion including a linear combination of a plurality of said sample points; and standardizing an interpolation filter which determines each weighting coefficient used in said weighting operation, so that the total of the weighting coefficients used when interpolation is performed on a first arbitrary point and the sum total of the weighting coefficients used when interpolation is performed on a second arbitrary point different from the first arbitrary point can be predetermined values.

12. A mark detection method according to claim 11, wherein said interpolation method includes performing a weighting operation by the use of said plurality of said sample points located in the vicinity of said arbitrary point.

13. A mark detection method according to claim 11, wherein when said predetermined sampling interval is T, and said interpolation filter includes an interpolation function s(dx) represented as:

$$s(dx) = \frac{\sin(2\pi dx/2T)}{2\pi dx/2T}.$$

14. A mark detection method according to claim 13, wherein said interpolation filter S(dx) is represented as S(dx)=s(dx)·W(dx), which is a product of said interpolation function s(dx) and a window function W(dx) converging an end portion of said interpolation function s(dx) to zero.

15. A mark detection method according to claim 14, wherein when a length of a window is R, said window function W(dx) is represented as:

$$W(dx) = \frac{1 + \cos(2\pi dx/R)}{2}$$

16. A mark detection method according to claim 11, wherein said standardization converts the respective coefficients of said interpolation filter by dividing the respective coefficients by the sum total of the respective coefficients.

17. A mark detection method according to claim 11, wherein a smoothing processing of removing a periodic component equal to or less than a predetermined cycle from said image signal output as a sample point at said predetermined sampling intervals.

18. A mark detection method according to claim 17, wherein said image pickup element has a pixel size $P_s$ a predetermined multiple of a minimum periodic component $P_{min}$ of an image formed on said image pickup element, and
said smoothing processing includes removing a periodic component equal to or less than $1/(1/P_s - 1/P_{min})$, on the basis of said pixel size $P_s$ and said minimum periodic component $P_{min}$.

19. A mark detection method according to claim 18, wherein said pixel size $P_s$ is larger than 0.5 times of said minimum periodic component $P_{min}$.

20. A mark detection method according to claim 11, wherein said interpolation is performed on said image signal itself.

21. A mark detection method according to claim 11, wherein said image pickup element has a predetermined pixel size,
said predetermined sampling interval includes a cycle of said predetermined pixel size, and
said interpolation is performed in a cycle equal to or less than said predetermined pixel size.

22. A mark detection method according to claim 21, wherein said pixel size is a predetermined times of a minimum periodic component of an image formed on said image pickup element.

23. A mark detection method according to claim 22, wherein said mark is irradiated with a detection beam, and an image of said mark is formed through an image-forming system, said minimum periodic component is defined by $\lambda/2NA$ on the basis of a wavelength $\lambda$ of said detection beam and the numerical aperture NA of said image-forming system.

24. A mark detection method according to claim 23, wherein said pixel size is equal to or more than 0.2 times of said minimum periodic component.

25. A mark detection method according to claim 24, wherein said pixel size is equal to or less than 0.5 times of said minimum periodic component.

26. A mark detection method according to claim 25, wherein said pixel size is equal to or more than 0.39 times of said minimum periodic component, or is equal to or less than 0.41 times of said minimum periodic component.

27. A mark detection method according to claim 11, wherein the position of said object is measured based on said interpolated image signal.

28. A mark detection method according to claim 27, wherein said predetermined sampling interval is determined based on an amount of position measurement error of said measurement.

29. A mark detection method according to claim 27, wherein said object is a substrate onto which a circuit pattern is transferred, and
said amount of position measurement error in said predetermined sampling interval has a value of one-fourth a minimum line width of said circuit pattern on which the total overlay is transferred onto said substrate.

30. A mark detection method comprising:
irradiating a mark formed on an object with a detection beam;
forming an image of said mark through an image-forming system;
converting the image of said mark formed on an image pickup element into an electrical image signal in order to output a signal related to said electrical image signal at predetermined sampling intervals; and
performing interpolation on said signal related to said electrical image signal in a cycle equal to or less than said predetermined sampling interval;
wherein said interpolation is performed with respect to a correlation function obtained based on said image signal.

31. An exposure method, wherein said object is a substrate onto which a predetermined pattern is transferred, and said predetermined pattern is transferred onto said substrate aligned on the basis of a mark detected by the use of said mark detection method according to claim 1.

32. An exposure method, wherein said object is a substrate onto which a predetermined pattern is transferred, and said predetermined pattern is transferred onto said substrate aligned on the basis of a mark detected by the use of said mark detection method according to claim 11.

33. An exposure method, wherein said object is a substrate onto which a predetermined pattern is transferred, and said predetermined pattern is transferred onto said substrate aligned on the basis of a mark detected by the use of said mark detection method according to claim 30.

34. A device manufacturing method, wherein a device is manufactured by the use of said exposure method of transferring said predetermined pattern onto said substrate according to claim 31.

35. A device manufacturing method, wherein a device is manufactured by the use of said exposure method of transferring said predetermined pattern onto said substrate according to claim 32.

36. A device manufacturing method, wherein a device is manufactured by the use of said exposure method of transferring said predetermined pattern onto said substrate according to claim 33.

37. A mark detection apparatus comprising:
an irradiation system which irradiates a mark formed on an object with a detection beam;
an image-forming system which forms an image of a mark on an image-forming surface;
an image pickup element disposed on said image-forming surface;
a sampling device, which is electrically connected to the image pickup element, and which converts the image of said mark into an electrical image signal in order to output a signal related to the image signal in a predetermined sampling interval;
a smoothing device, which is electrically connected to the sampling device, and which removes a periodic component equal to or less than a predetermined cycle from a signal output at said sampling intervals by said sampling device; and an interpolation device, which is electrically connected to the smoothing device, and which interpolates the smoothed sign related to said image signal in a cycle equal to or less than said predetermined sampling interval, wherein said image pickup element has a pixel size $P_s$ which is a predetermined multiple of a minimum periodic component $P_{min}$ of an image formed on said image pickup element, and said smoothing device removes a periodic component equal to or less than $1/(1/P_s - 1/P_{min})$, on the basis of said pixel size $P_s$ and said minimum periodic component $P_{min}$.

38. A mark detection apparatus according to claim 37, wherein said pixel size $P_s$ is larger than 0.5 times of said minimum periodic component $P_{min}$.

39. A mark detection apparatus according to claim 37, wherein said sampling device outputs said image signal at said predetermined sampling intervals, and said interpolation device performs interpolation with respect to said image signal.

40. An exposure apparatus comprising a mark detection apparatus according to claim 37, wherein said object is a substrate to be transferred with a predetermined pattern, and said exposure apparatus transfers said predetermined pattern onto said substrate positioned based on a mark detected by said mark detection apparatus.

41. A device manufactured through a step of transferring said predetermined pattern onto said substrate by said exposure apparatus according to claim 40.

42. A mark detection apparatus comprising:

a sampling device which picks up an image of a mark formed on an object, converts said image of said mark into an electrical image signal, and outputs a signal related to said image signal at predetermined sampling intervals;

an interpolation device, which is electrically connected to the sampling device, and which interpolates an arbitrary point having a cycle equal to or less than said predetermined sampling interval by an interpolation method including a weighting operation using said plurality of said sample points located in the vicinity of said arbitrary point; and a standardizing device, which is electrically connected to the interpolation device, and which standardizes an interpolation filter which determines each weighting coefficient used in said weighting operation, so that the total of the weighting coefficients used when interpolation is performed on a first arbitrary point and the sum total of the weighting coefficients used when interpolation is performed on a second arbitrary point different from the first arbitrary point can be predetermined values.

43. A mark detection apparatus according to claim 42, wherein when said predetermined sampling interval is T, and said interpolation filter includes an interpolation function s(dx) represented as:

$$s(dx) = \frac{\sin(2\pi dx/2T)}{2\pi dx/2T}$$

44. A mark detection apparatus according to claim 42, wherein said mark detection apparatus irradiates said mark with a detection beam, and forms an image of said mark through an image-forming system;

said image pickup element has a said pixel size which is a predetermined multiple of a minimum periodic component of an image formed on said image pickup element;

said minimum periodic component is defined by $\lambda/2NA$ on the basis of a wavelength $\lambda$ of said detection beam and the numerical aperture NA of said image-forming system; and said pixel size is equal to 0.2 times or more and 0.5 times or less of said minimum periodic component.

45. A mark detection apparatus according to claim 42, wherein said sampling device outputs said image signal at said predetermined sampling intervals, and said interpolation device performs interpolation with respect to said image signal.

46. An exposure apparatus comprising a mark detection apparatus according to claim 42, wherein said object is a substrate to be transferred with a predetermined pattern, and said exposure apparatus transfers said predetermined pattern onto said substrate positioned based on a mark detected by said mark detection apparatus.

47. A device manufactured through a step of transferring said predetermined pattern onto said substrate by said exposure apparatus according to claim 46.

48. A mark detection device comprising:

an irradiation system which irradiates a mark formed on an object with a detection beam;

an image-forming system which forms an image of a mark on an image-forming surface;

a sampling device which includes an image pickup element disposed on said image-forming surface, converts said image of said mark into an electrical image signal, and outputs a signal related to said image signal at a predetermined sampling intervals; and an interpolation device, which is electrically connected to the sampling device, and which performs interpolation of said signal related to said electrical image signal in a cycle equal to or less than said predetermined sampling interval;

wherein said interpolation device performs said interpolation with respect to a correlation function obtained based on said image signal.

49. A mark detection apparatus according to claim 48, wherein said sampling device outputs said image signal at said predetermined sampling intervals, and said interpolation device performs interpolation with respect to said image signal.

50. An exposure apparatus comprising a mark detection apparatus according to claim 48, wherein said object is a substrate to be transferred with a predetermined pattern, and said exposure apparatus transfers said predetermined pattern onto said substrate positioned based on a mark detected by said mark detection apparatus.

51. A device manufactured through a step of transferring said predetermined pattern onto said substrate by said exposure apparatus according to claim 50.

* * * * *